United States Patent
Miyake

(10) Patent No.: US 9,344,062 B2
(45) Date of Patent: May 17, 2016

(54) SEMICONDUCTOR DEVICE, DRIVING METHOD THEREOF, AND ELECTRONIC DEVICE

(71) Applicant: Semiconductor Energy Laboratory Co., Ltd., Atsugi-shi, Kanagawa-ken (JP)

(72) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/868,316

(22) Filed: Apr. 23, 2013

(65) Prior Publication Data

US 2013/0285711 A1 Oct. 31, 2013

(30) Foreign Application Priority Data

Apr. 30, 2012 (JP) ................................ 2012-104284
Mar. 15, 2013 (JP) ................................ 2013-053383

(51) Int. Cl.
*H03K 3/00* (2006.01)
*H03K 3/012* (2006.01)
*H03K 19/00* (2006.01)

(52) U.S. Cl.
CPC ............ *H03K 3/012* (2013.01); *H03K 19/0013* (2013.01)

(58) Field of Classification Search
None
See application file for complete search history.

(56) References Cited

U.S. PATENT DOCUMENTS

| | | | |
|---|---|---|---|
| 5,719,529 A * | 2/1998 | Kawahara et al. | 330/253 |
| 6,124,749 A | 9/2000 | Morishima | |
| 6,310,487 B1 * | 10/2001 | Yokomizo | 324/750.3 |
| 7,411,423 B2 * | 8/2008 | Berthold et al. | 326/98 |
| 7,746,127 B2 * | 6/2010 | Miyazaki et al. | 327/112 |
| 8,148,953 B2 * | 4/2012 | Cho et al. | 320/166 |
| 8,400,778 B2 * | 3/2013 | Hsing et al. | 361/772 |
| 8,686,762 B2 * | 4/2014 | Zeng | 327/108 |
| 2005/0195150 A1 * | 9/2005 | Etoh et al. | 345/100 |
| 2009/0140780 A1 * | 6/2009 | Miyazaki et al. | 327/112 |
| 2011/0001732 A1 * | 1/2011 | Morii et al. | 345/204 |

(Continued)

FOREIGN PATENT DOCUMENTS

JP 2011-044025 A 3/2011

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center—published in Japan, with English translation.

(Continued)

*Primary Examiner* — Lincoln Donovan
*Assistant Examiner* — Khareem E Almo
(74) *Attorney, Agent, or Firm* — Fish & Richardson P.C.

(57) ABSTRACT

To achieve low power consumption of a semiconductor device including a plurality of function blocks capable of being in either an operating state or a not-operating state, by effective use of electric charge discharged from a not-operating function block. In a semiconductor device including a plurality of function blocks, a capacitor is electrically connected to the plurality of function blocks so that electric charge discharged from a not-operating function block is accumulated in the capacitor. Then, the electric charge accumulated in the capacitor is supplied to a function block to be in an operating state, and then power is supplied from a power source to the function block.

19 Claims, 14 Drawing Sheets

(56) References Cited

U.S. PATENT DOCUMENTS

| | | |
|---|---|---|
| 2011/0089975 A1 | 4/2011 | Yamazaki et al. |
| 2011/0101332 A1 | 5/2011 | Yamazaki et al. |
| 2011/0121878 A1 | 5/2011 | Kato et al. |
| 2011/0148463 A1 | 6/2011 | Kato et al. |
| 2011/0187410 A1 | 8/2011 | Kato et al. |
| 2011/0188218 A1* | 8/2011 | Hsing et al. .................. 361/772 |
| 2012/0105407 A1* | 5/2012 | Zhan et al. ................... 345/209 |
| 2012/0113737 A1* | 5/2012 | Lee et al. ...................... 365/226 |
| 2012/0120041 A1* | 5/2012 | Kohno et al. ................. 345/211 |
| 2012/0242711 A1* | 9/2012 | Choi et al. ................... 345/690 |
| 2013/0003888 A1* | 1/2013 | Zeng .............................. 375/295 |
| 2013/0321376 A1* | 12/2013 | Kim et al. ..................... 345/212 |
| 2014/0077756 A1* | 3/2014 | Kataoka et al. ............... 320/107 |
| 2014/0126318 A1* | 5/2014 | Jeong et al. ................ 365/225.7 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

\* cited by examiner

SEMICONDUCTOR DEVICE, DRIVING METHOD THEREOF, AND ELECTRONIC DEVICE

BACKGROUND OF THE INVENTION

1. Field of the Invention

The present invention relates to a semiconductor device, a driving method thereof, and an electronic device.

2. Description of the Related Art

Among semiconductor devices including a plurality of components (e.g., computers), attention is given to semiconductor devices in which supply of power to components not in operation is stopped (i.e., the supply of power is in off state) so as to achieve low power consumption, which is also referred to as power gating.

As such a semiconductor device, for example, Patent Document 1 discloses a structure which is provided with a power gating control unit for each function block, which needs to drive a semiconductor device, so as to stop the supply of power supply voltage to the function block that does not necessarily operate, in accordance with a signal output from a power gating control information generating part.

REFERENCE

[Patent Document 1] Japanese Published Patent Application No. 2011-44025

SUMMARY OF THE INVENTION

FIG. 9 is a simple block diagram of a semiconductor device which includes a plurality of function blocks capable of performing power gating. FIG. 9 illustrates a semiconductor device assuming that the semiconductor device includes four function blocks capable of performing power gating for easy understanding of the structure.

Note that in this specification, a "function block" is a circuit block formed in such a manner that components for driving the semiconductor device are classified according to their functions. For example, a circuit having a function of holding data can be referred to a "memory circuit block" and a circuit having a function of performing arithmetic processing can be referred to as an "arithmetic circuit block". Of course, "function block" is not limited thereto.

A semiconductor device 1000 illustrated in FIG. 9 includes function blocks 1001a to 1001d capable of performing power gating, switching elements 1002a to 1002d which are electrically connected to the function blocks 1001a to 1001d and determine states of supplying power to the function blocks, and a control circuit 1005 for determining conduction states (on or off) of the switching elements. Power is supplied from a power source 1006 to the function blocks 1001a to 1001d and the control circuit 1005. Note that a wiring connecting the switching element and the function block serves as a high potential power supply line of the function block. For example, a wiring 1010 in FIG. 9 serves as a high potential power supply line of the function block 1001a. In addition, each of the function blocks is connected to a wiring for supplying a constant potential (e.g., a ground and a body earth), which is also referred to as a low potential power supply wiring and denoted by VSS in drawings.

With the control circuit 1005, which function blocks are supplied with power or whether the supply of power is stopped is determined one by one depending on an operation state of the semiconductor device 1000. On the basis of the determination, the switching elements 1002a to 1002d are turned on or off.

Here, a schematic operation flow of the semiconductor device 1000 will be described with reference to FIGS. 10A to 10C. Note that a part through which an electric signal flows is shown by a bold solid line.

In the semiconductor device 1000, first, an operating function block and a not-operating function block are determined with the control circuit 1005. Here, the function blocks 1001a and 1001c are operating function blocks, and the function blocks 1001b and 1001d are not-operating function blocks. Then, the switching elements connected to the operating function blocks (i.e., the switching elements 1002a and 1002c) are turned on and the switching elements between the power source 1006 and each of the not-operating function blocks (i.e., the switching elements 1002b and 1002d) are turned off. As a result, power is supplied to the function blocks 1001a and 1001c (see FIG. 10A). At the time when power (also referred to as electric charge) needed for driving each function block is charged, the function blocks 1001a and 1001c start to operate. Note that in drawings, a function block which is hatched is an operating function block.

Next, an operating function block and a not-operating function block are determined again with the control circuit 1005. Here, the function blocks 1001a and 1001c are not-operating function blocks and the function blocks 1001b and 1001d are operating function blocks. The switching elements 1002a and 1002c are turned off and the switching elements 1002b and 1002d are turned on. As a result, power is supplied to the function blocks 1001b and 1001d (see FIG. 10B). At the time when power needed for driving the function blocks 1001b and 1001d is charged, the function blocks 1001b and 1001d start to operate.

At this time, when attention is focused on the function blocks 1001a and 1001c, overlapping wirings or the like causes parasitic capacitance in the function blocks, and accordingly, a certain amount of electric charge is accumulated in each of the function blocks in operation. However, as illustrated in FIG. 10C, the electric charge accumulated in the function blocks are discharged to VSS over time when the function blocks do not operate. The electric charge contributes nothing to the operation of the semiconductor device.

In view of the above problem, an object of one embodiment of the present invention is to provide a semiconductor device which effectively uses electric charge discharged from a not-operating function block to operate with low power consumption.

Alternatively, an object is to provide a method for driving the semiconductor device operating with low power consumption.

In this specification, it is an object to achieve at least one of the above objects.

In a semiconductor device including a plurality of function blocks capable of performing power gating, a capacitor is electrically connected to the plurality of function blocks so that electric charge discharged from a not-operating function block is accumulated in the capacitor. Then, the electric charge accumulated in the capacitor is supplied to a function block to be in an operating state, and then power is supplied from a power source to the function block.

That is, one embodiment of the present invention is a semiconductor device which includes a plurality of function blocks capable of performing power gating, a first switching element configured to determine a state of supplying power to the function block, a capacitor having electrodes one of which is connected to at least two of the function blocks and the other of which is connected to a wiring for supplying a fixed potential, a second switching element provided between the function block and the capacitor and configured to determine a conduction state between the function block and the capacitor, and a control circuit which is electrically connected to the first switching element and the second switching element and is configured to control a conduction state of the first switching element and a conduction state of the second switching element. Supply of power to at least one of the function blocks is stopped and then the second switching element is turned on, so that electric charge is supplied to the capacitor. Electric charge is supplied from the capacitor and then power is supplied to at least one of the function blocks, so that the function block is in an operating state.

In a semiconductor device with the above structure, electric charge accumulated in a not-operating function block can be used for increasing voltage of a function block which is to be in operation. Accordingly, the function block which is to be in operation can be in an operation state with the supply of small amount of power, which results in low power consumption of the semiconductor device.

Another embodiment of the present invention is a semiconductor device which includes a plurality of function blocks capable of performing power gating, a first switching element configured to determine a state of supplying power to the function block, a capacitor having electrodes one of which is connected to at least two of the function blocks and the other of which is connected to a wiring for supplying a fixed potential, a second switching element provided between the function block and the capacitor and configured to determine a conduction state between the function block and the capacitor, a control circuit which is electrically connected to the first switching element and the second switching element and is configured to control a conduction state of the first switching element and a conduction state of the second switching element, and a potential comparing unit configured to compare a potential applied to a high potential power supply line of each of the function blocks and a potential applied to the one of the electrodes of the capacitor and output an operation instruction to the control circuit on the basis of a comparison result. When the comparison result obtained by the potential comparing unit shows that the potential applied to the high potential power supply line of the function block is higher than the potential applied to the one of the electrodes of the capacitor, the supply of power to the function block is stopped and then the second switching element is turned on, so that electric charge is supplied to the capacitor. When the comparison result obtained by the potential comparing unit shows that the potential applied to the high potential power supply line of the function block is lower than the potential applied to the one of the electrodes of the capacitor, electric charge is supplied from the capacitor and then power is supplied to the function block, so that the function block becomes an operating state.

In a semiconductor device with the above structure, unexpected supply of electric charge can be prevented. For example, unexpected supply of electric charge means the following case: electric charge is supplied from the capacitor to a function block when electric charge is intended to be supplied from the function block to the capacitor, or electric charge is supplied from a function block to the capacitor when electric charge is intended to be supplied from the capacitor to the function block.

Note that in the above semiconductor device, at least one of the plurality of function blocks preferably includes a data retention system with which data can be held even without the supply of power. A function block including such a data retention system can accumulate the state immediately before the function block becomes a not-operating state (e.g., an operation state or held data) in the data retention system before the function block becomes a not-operating state. Accordingly, at the time of resuming operation, the function block can be swiftly restored with the data to the state immediately before the function block becomes a not-operating state, which results in an increased operation speed of the semiconductor device.

In addition, an electronic device including the semiconductor device is also one embodiment of the present invention.

Another embodiment of the present invention is a method for driving a semiconductor device comprising a plurality of function blocks capable of performing power gating; a first switching element configured to determine a state of supplying power to the function block; a capacitor having electrodes one of which is connected to at least two of the function blocks and the other of which is connected to a wiring for supplying a fixed potential; a second switching element provided between the function block and the capacitor and configured to determine a conduction state between the function block and the capacitor; and a control circuit which is electrically connected to the first switching element and the second switching element and is configured to control a conduction state of the first switching element and a conduction state of the second switching element. The method includes a function block stopping step in which the first switching element is turned off to stop the supply of power to the function block, so that an operation of the function block is stopped; a capacitor charging step in which after the function block stopping step, the second switching element is turned on to supply electric charge from the function block to the capacitor; a function block operation step in which the first switching element is turned on to supply power to the function block, so that the function block operates; and a function block charging step in which before the function block operation step, the second switching element is turned on to supply electric charge from the capacitor to the function block.

By the above driving method, electric charge accumulated in the not-operating function block is supplied to the capacitor and the electric charge is supplied to a function block which is to be in operation, whereby the voltage of the function block can be increased. Accordingly, the function block which is to be in operation can be in an operation state with the supply of small amount of power, which results in low power consumption of the semiconductor device.

Another embodiment of the present invention is a method for driving a semiconductor device comprising a plurality of function blocks capable of performing power gating; a first switching element configured to determine a state of supplying power to the function block; a capacitor having electrodes one of which is connected to at least two of the function blocks and the other of which is connected to a wiring for supplying a fixed potential; a second switching element provided between the function block and the capacitor and configured to determine a conduction state between the function block and the capacitor; a control circuit which is electrically connected to the first switching element and the second switching element and is configured to control a conduction state of the first switching element and a conduction state of the second switching element; and a potential comparing unit configured to compare a potential applied to a high potential power supply line of each of the function blocks and a potential applied to the one of the electrodes of the capacitor and output an operation instruction to the control circuit on the basis of a comparison result. The method includes a function block stopping step in which the first switching element electrically connected to the function block is turned off to stop the supply of power to the function block, so that an operation of the function block is stopped; a capacitor charging step in which after the function block stopping step, the second switching element electrically connected to the function block, the potential applied to the high potential power supply line of which is found to be lower than the potential applied to one of the electrodes of the capacitor as a comparison result, is turned on to supply electric charge from the function block to the capacitor; a function block operation step in which the first switching element electrically connected to the function block is turned on to supply power to the function block, so that the function block operates; and a function block charging step in which before the function block operation step, when the potential applied to the high potential power supply line of the function block is higher than the potential applied to one of the electrodes of the capacitor, the second switching element electrically connected to the function block is turned on to supply electric charge from the capacitor to the function block.

By the above driving method, electric charge can be prevented from being supplied from the capacitor to the function block in a capacitor charging step and is prevented from being supplied from the function block to the capacitor in a function block charging step.

In the above semiconductor device, at least one of the plurality of function blocks includes a data retention system capable of retaining data even without the supply of power. A state of the function block is written to the data retention system before completion of the function block stopping step, and content written to the data retention system is read to the function block immediately after start of the function block operation step. Accordingly, the function block can be swiftly restored to the state immediately before the function block becomes a not-operating state, which results in a high operation speed of the semiconductor device.

Note that in the above driving method of the semiconductor device, when a first switching element and a second switching element which are electrically connected to a function block are turned on concurrently, power to be supplied to the function block flows to the capacitor, which poses a problem such as an increase in power consumption for driving the function block. Therefore, it is preferable that the first switching element and the second switching element be not turned on concurrently.

Further, in the above method for driving the semiconductor device, in a function block charging step, electric charge is preferably supplied to a function block different from the function block supplied with electric charge in a capacitor charging step, which may result in low power consumption of the plurality of function blocks.

Note that a semiconductor device includes a plurality of function blocks (two or more function blocks), and thus it is preferable that electric charge be supplied from two or more function blocks to a capacitor at the same time and be supplied from the capacitor to two or more function blocks at the same time, which may result in reduced power consumption in the plurality of function blocks.

In a semiconductor device having a structure described in this specification or the like, electric charge accumulated in a function block (e.g., electric charge accumulated at an intersection point of wirings in a function block) which is discharged in the case of conventional devices can be used for operating the function block, which results in reduction in power consumption of the semiconductor device.

DETAILED DESCRIPTION OF THE INVENTION

Figure 1:
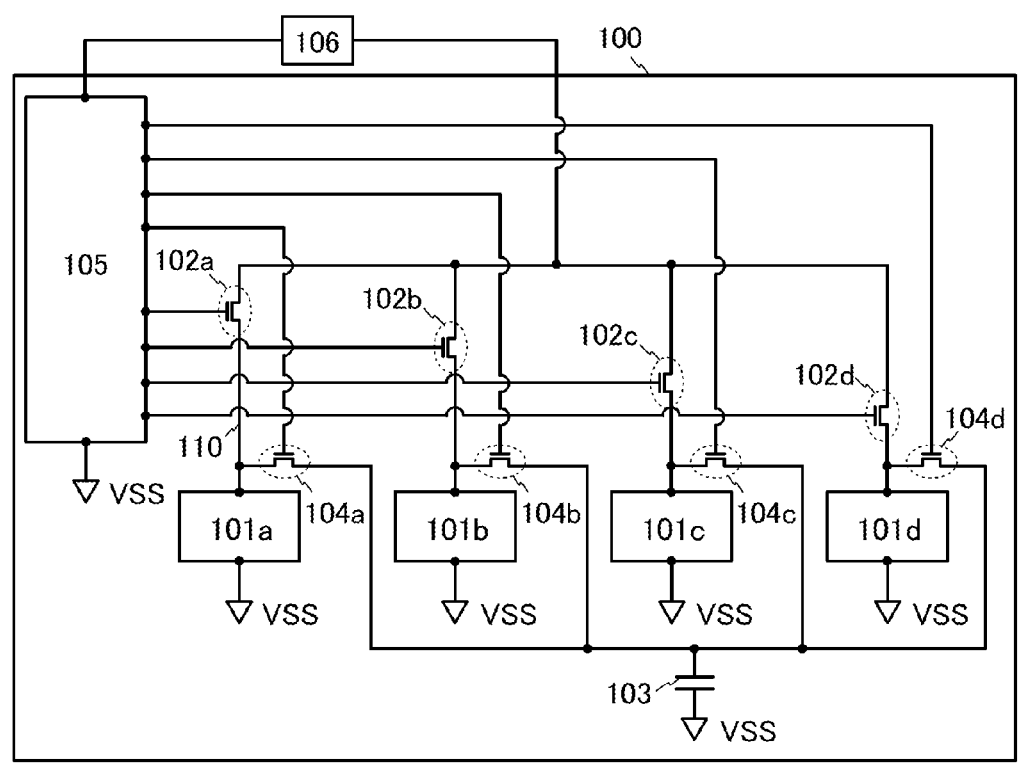
FIG. 1 is a block diagram illustrating one example of a structure of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that in the following embodiments, the same portions or portions having similar functions are denoted by the same reference numerals in different drawings, and explanation thereof will not be repeated.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Note that a node in this specification and the like means an element (e.g., a wiring) which enables electric connection between elements included in a circuit. Therefore, a "node to which A is connected" is a wiring which is electrically connected to A and can be regarded as having the same potential as A. Even when one or more elements which enable electrical connection (e.g., switches, transistors, capacitors, inductors, resistors, or diodes) are in a portion of the wiring, the wiring can be regarded as the "node to which A is connected" as long as it has the same potential as A.

Embodiment 1

In this embodiment, a structure of a semiconductor device will be described with reference to a block diagram of FIG. 1. In addition, one example of a method for driving the semiconductor device will be described with reference to FIGS. 2A and 2B, FIGS. 3A and 3B, and FIG. 4.

<Example of Structure of Semiconductor Device>

FIG. 1 is a block diagram illustrating one example of a semiconductor device 100 having an effect described in this specification or the like. The semiconductor device 100 includes function blocks 101a to 101d capable of performing power gating, first switching elements 102a to 102d which are electrically connected to the function blocks 101a to 101d and determine states of supplying power to each function block, a capacitor 103 one of electrodes of which is connected between the function blocks and the first switching elements and the other of electrodes of which is connected to a wiring for supplying a fixed potential, second switching elements 104a to 104d which are provided between the function blocks and the capacitor 103 and determine conduction states (a conduction state or a non-conduction state) between the function blocks and the capacitor, and a control circuit 105 which determines conduction states of the first switching elements 102a to 102d and the second switching elements 104a to 104d. Note that power is supplied from a power source 106 to the function blocks 101a to 101d and the control circuit 105 which are included in the semiconductor device 100.

Note that a wiring connecting the first switching element and the function block serves as a high potential power supply line of each function block. For example, a wiring 110 in FIG. 1 serves as a high potential power supply line of the function block 101a.

In the drawings of this specification, a transistor is illustrated as a switching element for easy understanding of the drawings; however the switching element is not limited to a transistor. As the switching element, a transistor including an oxide semiconductor material in a semiconductor layer (at least in a channel region) (hereinafter also referred to as OS transistor) is preferably used. As described later, an OS transistor has an extremely low off-state current. Therefore, when the switching element is in an off state, electric charge can be held in the capacitor 103 for a long time.

The function blocks 101a to 101d are each a circuit block formed in such a manner that various components for driving the semiconductor device are classified according to their functions. Note that at least one of the function blocks 101a to 101d preferably includes a data retention system (also referred to as a nonvolatile data retention system) with which data can be held even without the supply of power. With the structure, the state immediately before the function block becomes a not-operating state (e.g., an operation state or held data) can be accumulated in the nonvolatile data retention system before the function block becomes a not-operating state. Accordingly, at the time of resuming operation, the function block can be swiftly restored with the data to the state immediately before the function block becomes a not-operating state, which results in a high operation speed of the semiconductor device.

Examples of a nonvolatile data retention system are nonvolatile memories such as magnetoresistive random access memory (MRAM), ferroelectric random access memory (FeRAM), and flash memory. The nonvolatile data retention system can be a memory including an OS transistor.

The band gap of an oxide semiconductor material in the semiconductor layer used for a semiconductor layer of the OS transistor is greater than or equal to 3.0 eV (electron volts), which is much larger than the band gap of silicon (1.1 eV).

The off-resistance of the transistor (resistance between source and drain when the transistor is in an off-state) is inversely proportional to the concentration of carriers thermally excited in the semiconductor layer where a channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

On the other hand, in the case of a semiconductor whose band gap is 3.2 eV (an oxide semiconductor, here), the concentration of thermally excited carriers is approximately $1 \times 10^{-7}$ cm$^{-3}$. When the electron mobility is the same, the resistivity is inversely proportional to the carrier concentration, and thus the resistivity of the semiconductor having a band gap of 3.2 eV is higher by 18 digits than that of silicon.

Such a transistor in which an oxide semiconductor material having a wide band gap is used for a semiconductor layer (OS transistor) can achieve an extremely low off-state current. Therefore, a memory including the transistor can hold data for a long time without the supply of power. Note that an OS transistor can be formed using the same apparatus and method as those of a thin film transistor using silicon or the like, which can reduce the burden of new capital investment or a study of the manufacturing method. Thus, a memory including an OS transistor is one preferable mode of nonvolatile memory.

Here, one example of a structure of a memory including an OS transistor will be described with reference to FIGS. 11A and 11B.

Figure 11A:
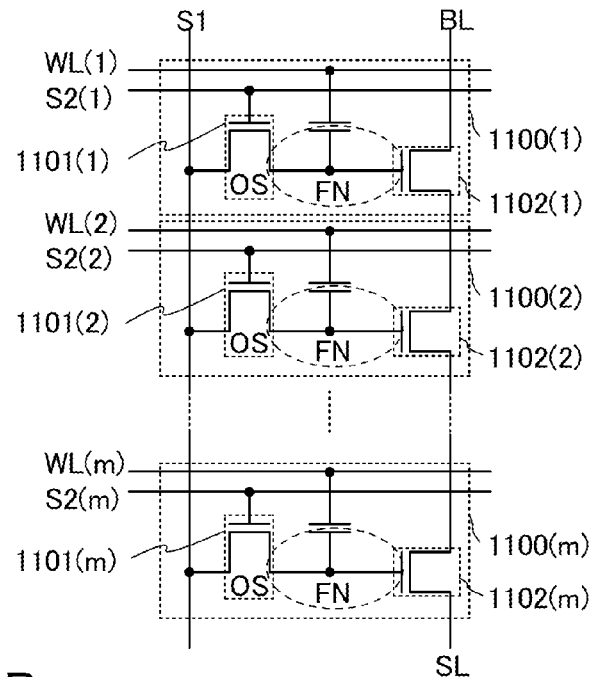
FIGS. 11A and 11B are circuit diagrams each illustrating one example of a structure of a nonvolatile data retention system.
Figure 11B:
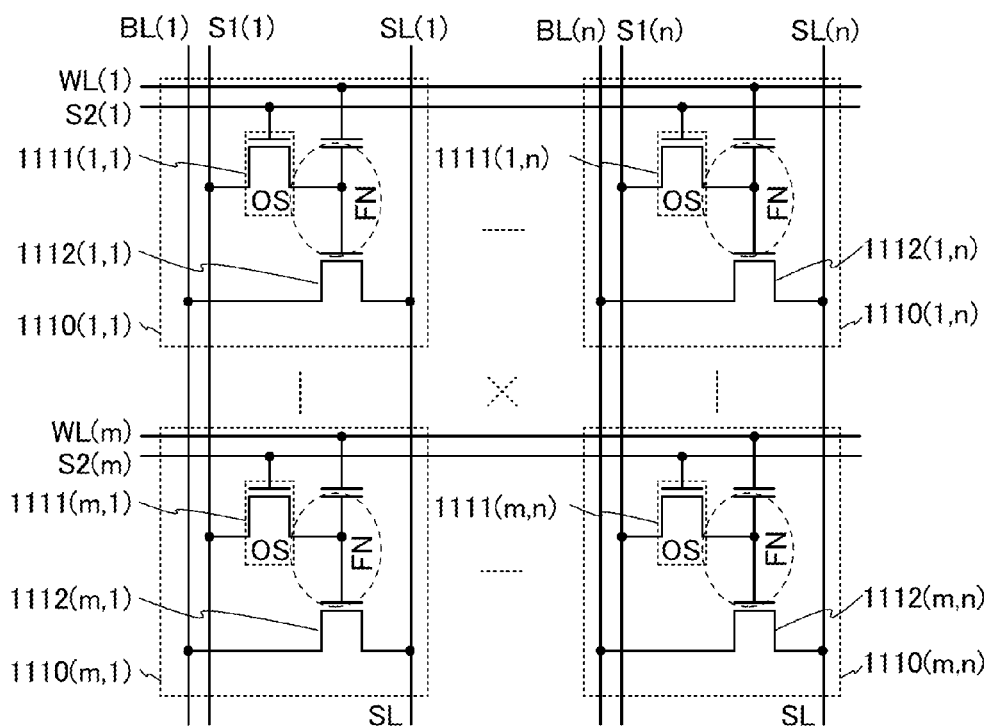

FIGS. 11A and 11B are circuit diagrams of part of a structure of a nonvolatile memory including a plurality of OS transistors. Note that in FIGS. 11A and 11B, a transistor beside which "OS" is written is an OS transistor. In FIGS. 11A and 11B, "WL", "BL", "SL", "S1", and "S2" represent a word line, a bit line, a source line, a first signal line, and a second signal line, respectively.

FIG. 11A is a circuit diagram of what is called a NAND semiconductor device in which memory cells 1100(1) to 1100(*m*) are connected in series. Transistors 1101(1) to 1101(*m*) are OS transistors. Note that there is no particular limitation on a material used as a semiconductor layer of each of transistors 1102(1) to 1102(*m*); however, each of the transistors 1102(1) to 1102(*m*) includes a silicon material in a semiconductor layer here.

An OS transistor has an extremely low off-state current. Therefore, turning off the transistors 1101(1) to 1101(*m*) enables electric charge (i.e., data) to be held at floating nodes FN at each of which two transistors and a capacitor are electrically connected. Accordingly, a memory with the structure illustrated in FIG. 11A functions as a nonvolatile memory capable of holding data for a long time.

FIG. 11B is a circuit diagram of what is called a NOR semiconductor device in which memory cells 1110(1,1) to 1110(*n,m*) are connected in parallel.

In the structure, using OS transistors as transistors 1111(1,1) to 1111(*m,n*) enables electric charge to be held at floating nodes FN. Accordingly, a memory with a structure illustrated in FIG. 11B functions as a nonvolatile memory capable of holding data for a long time. Note that there is no particular limitation on a material used as a semiconductor layer of each of transistors 1112(1,1) to 1112(*m,n*); however, each of the transistors 1112(1,1) to 1112(*m,n*) includes a silicon material in a semiconductor layer here.

Figure 12:
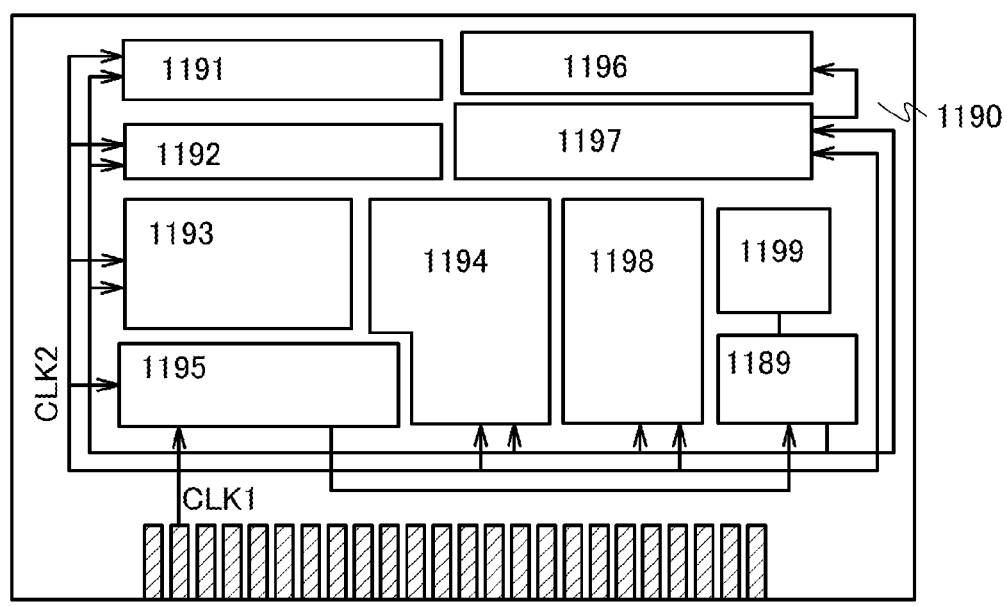
FIG. 12 is a diagram illustrating one specific example of a function block.

In the above description, a circuit having a function of performing arithmetic processing can be referred to as an "arithmetic circuit block". For example, in the case of using a central processing unit (CPU) as an arithmetic circuit block, the CPU includes, as illustrated in FIG. 12, various components over a substrate 1190, such as an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable memory device 1199, and a ROM interface (ROM I/F) 1189. When these components each include a nonvolatile data retention system, each of the components can be also regarded as a function block. Note that the CPU illustrated in FIG. 12 is only an example in which the configuration is simplified, and actual CPUs have various configurations depending on applications.

There is no particular limitation on details on what kinds of nonvolatile data retention system, element, and circuit structure a function block includes. Known techniques can be referred to for the details.

In the semiconductor device 100 illustrated in FIG. 1, the function blocks 101a to 101d are connected to the power source 106 through the first switching elements 102a to 102d, respectively. The conduction states of the first switching elements 102a to 102d are determined by signals output from the control circuit 105.

In the case of turning off the first switching element to stop the supply of power to the function block connected to the switching element, the function block needs to hold a state immediately before the function block becomes a not-operating state in a nonvolatile data retention system so that the state immediately before the function block becomes a not-operating state (e.g., an operation state and a state of stored data) is restored when the supply of power is resumed. There is no particular limitation on a method for storing the state immediately before the function block becomes a not-operating state, and a known method may be used.

Note that in FIG. 1, the power source 106 is outside the semiconductor device 100; however, the power source 106 may be inside the semiconductor device. Alternatively, the power source 106 may be freely removed.

The function blocks 101a to 101d are connected to the capacitor 103 through the second switching elements 104a to 104d, respectively. The conduction states of the second switching elements 104a to 104d are determined by signals output from the control circuit 105. Note that the capacitor 103 is preferably connected to at least two function blocks. With the structure, function blocks can interchange electric charge according to the operation state of each of function blocks. For example, after the stop of the operation of the function block 101a, electric charge which is accumulated in the function block 101a and unnecessary for the function block 101a (also referred to as electric charge which does not affect the operation of the function block 101a) can be used for the operation of another function block. As a result, an effect of reducing power consumption of the semiconductor device can be improved.

The structure of the semiconductor device described in this specification is different from a conventional structure in that the semiconductor device includes a capacitor one of electrodes of which is connected between the function blocks and the first switching elements and the other of the electrode of which is connected to a wiring for supplying a fixed potential, and the second switching elements which are provided between the capacitor and the function blocks and can be controlled by the control circuit.

When the semiconductor device does not include the capacitor and the second switching elements, after the stop of the supply of power from the power source, electric charge accumulated in the function block (electric charge accumulated in the capacitor which is a component of the function block and a capacitance part such as an intersection point of wirings (parasitic capacitance)) or electric charge accumulated in a wiring between the first switching element and the function block (electric charge accumulated in a capacitance part such as an intersection point of wirings (parasitic capacitance)) is only discharged through VSS, that is, contributes nothing to the operation of the semiconductor device.

On the other hand, when the semiconductor device includes the capacitor and the second switching element, by turning on the second switching element after turning off the first switching element, at least part of electric charge accumulated in the function block and a wiring can be supplied to the capacitor 103. After that, the second switching element is turned off to hold the electric charge in the capacitor 103.

Before the first switching element is turned on to supply power from the power source 106 in order to switch the state of the function block from a not-operating state to an operating state, the second switching element is turned on to supply the electric charge accumulated in the capacitor 103 to the function block which is to be in operation so that the voltage of the function block is increased in advance. As a result, the voltage of the function block can be increased to an operation voltage with the supply of a small amount of power after the first switching element is turned on. Therefore, power consumption of the semiconductor device can be low.

In the semiconductor device described in this specification or the like, the plurality of function blocks share the capacitor 103; therefore, the plurality of function blocks can interchange electric charge. For example, electric charge in the function block 101a that stops operating can be supplied to the function block 101d which is to be in operation. Therefore, power consumption of the semiconductor device can be effectively low.

Note that although the number of the capacitors 103 is one in FIG. 1, there is no particular limitation on the number of the capacitors 103.

In accordance with the operation state of the semiconductor device 100, signals for determining operation states of the first switching elements 102a to 102d and the second switching elements 104a to 104d are output from the control circuit 105.

Note that the functions may be achieved by a plurality of control circuits. For example, a control circuit outputs signals only to the first switching elements 102a to 102d and another control circuit outputs signals only to the second switching elements 104a to 104d.

<Method for Driving Semiconductor Device>

Next, a method for driving the semiconductor device illustrated in FIG. 1 (also referred to as an operation flow) will be described with reference to FIGS. 2A and 2B, FIGS. 3A and 3B, and FIG. 4.

Note that in the following description, in order to clearly describe that the semiconductor device 100 is a semiconductor device which repeatedly performs processing of driving only part (function block) needed to operate, the case where first, only the function blocks 101a and 101c operate (and are stopped) and then only the function blocks 101b and 101d operate will be described. In addition, an effect of reducing power consumption of the semiconductor device 100 by the operation will be described.

<<Function Block Operation Step 1>>

The power source 106 starts up to supply power to the control circuit 105, and signals are output from the control circuit 105 to turn on the first switching elements 102a and 102c. In addition, signals are output from the control circuit 105 to turn off the first switching elements 102b and 102d and the second switching elements 104a to 104c.

With the above signals, the first switching elements 102a and 102c are turned on so that power is supplied to the function blocks. Then, the function blocks 101a and 101c start to operate at the time when the voltages applied to the function blocks reach the operation voltages (see FIG. 2A). Note that in FIG. 2A, the function blocks in operation are hatched. In the drawings of this specification, an arrow which points a switching element represents input of "a signal for turning on the switching element" which is output from the control circuit 105.

The function blocks 101*a* and 101*c* include a plurality of capacitors as part of components. Further, the function blocks 101*a* and 101*c* include many capacitance parts (capacitors) such as a wiring intersection point functioning as capacitance (parasitic capacitance). Therefore, when the function blocks operate, electric charge is accumulated in the capacitance parts (the capacitors). In addition, in a wiring between the function block 101*a* and the first switching element 102*a* and a wiring between the function block 101*c* and the first switching element 102*c*, electric charge is accumulated at an intersection point of wirings, and the like.

<<Function Block Stopping Step>>

Figure 2A:
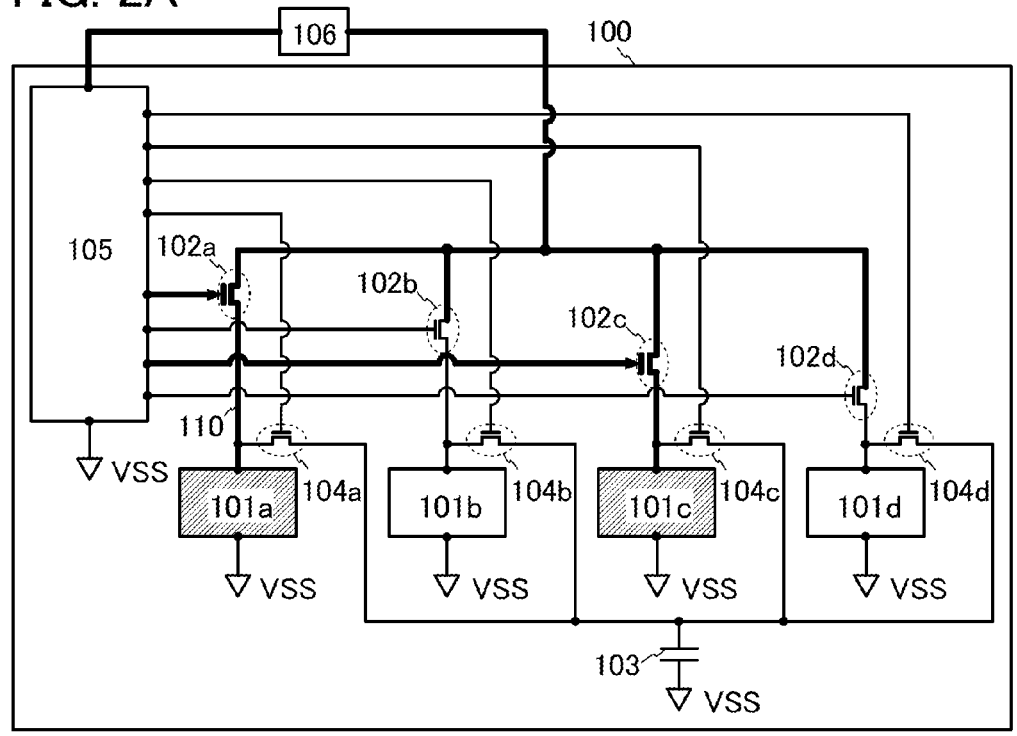
FIGS. 2A and 2B are block diagrams illustrating operating states of a semiconductor device.
Figure 2B:
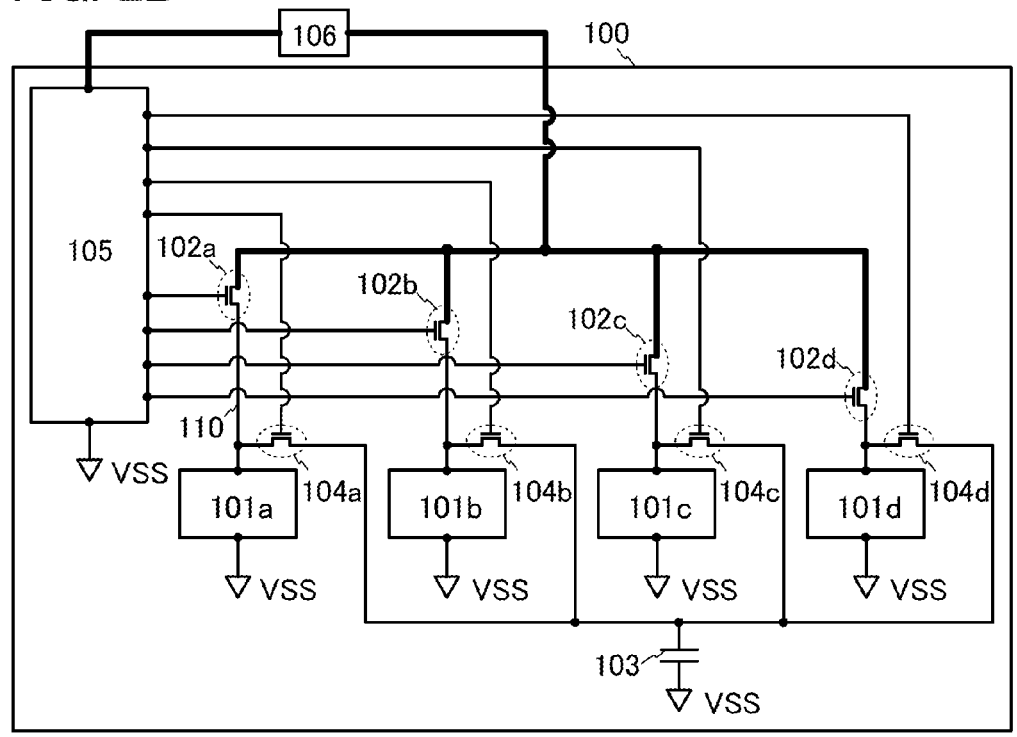

Next, signals for turning off the first switching elements 102*a* and 102*c* are output from the control circuit 105 to turn off the first switching elements 102*a* and 102*c*, whereby the operations of the function blocks 101*a* and 101*c* are stopped (see FIG. 2B).

At this time, electric charge accumulated in the function blocks 101*a* and 101*c*, electric charge accumulated in the wiring between the function block 101*a* and the first switching element 102*a*, and electric charge accumulated in the wiring between the function block 101*c* and the first switching element 102*c* are not removed at the instant when the first switching elements 102*a* and 102*c* are turned off, but flow out (also referred to as are discharged) from VSS over time.

Note that in the case where one or both of the function blocks 101*a* and 101*c* include nonvolatile data retention systems which can hold data even without the supply of power, it is preferable that the function block performs operation in which a state immediately before the function blocks become a not-operating state (e.g., an operating state and stored data) is written to the nonvolatile data retention system before the function block becomes a not-operating state (are stopped). With the structure, data written to the nonvolatile data retention system is read again at the time of resuming the operation of the function block, whereby the function block can be quickly restored by using the data to the state immediately before the function blocks become a not-operating state; therefore, the operation speed of the semiconductor device can be increased.

<<Capacitor Charging Step>>

The electric charge which flows out over time from VSS after the stop of the operation of the function block is wasted electric charge contributing nothing to the operation of the semiconductor device 100. Accordingly, next, in order to utilize the electric charge, signals for turning on the second switching elements 104*a* and 104*c* are output from the control circuit 105 to turn on the second switching elements 104*a* and 104*c*. As a result, electric charge accumulated in the function blocks 101*a* and 101*c* is supplied to the capacitor 103 (see FIG. 3A).

Note that the second switching elements 104*a* and 104*c* are preferably turned on after the first switching elements 102*a* and 102*c* are turned off (preferably at the same time when the first switching elements 102*a* and 102*c* are turned off). This is because when the first switching element and the second switching element are both turned on, power intended to be supplied to the function block flows to the capacitor 103, which might prevent the operation of the function block.

After that, signals for turning off the second switching elements 104*a* and 104*c* are output from the control circuit 105 to turn off the second switching elements 104*a* and 104*c*, whereby electric charge is held in the capacitor 103.

<<Function Block Charging Step>>

After the operations of the function blocks 101*a* and 101*c* are stopped, the function blocks 101*b* and 101*d* operate. Here, before power is supplied from the power source 106 to the function blocks 101*b* and 101*d*, first, signals for turning on the second switching elements 104*b* and 104*d* are output from the control circuit 105 to turn on the second switching elements 104*b* and 104*d*, and electric charge accumulated in the capacitor 103 in the above step is supplied to the function blocks 101*b* and 101*d* (see FIG. 3B).

Accordingly, the voltages of the function blocks 101*b* and 101*d* are increased. The level to which the voltage of the function block is increased by the supply of electric charge of the capacitor 103 is determined depending on the amount of electric charge accumulated in the capacitor 103. In addition, the supply of electric charge from the capacitor is stopped at the time when a potential applied to a high potential power supply line of the function block and a potential applied to one of electrodes of the capacitor become equal to each other.

Figure 3A:
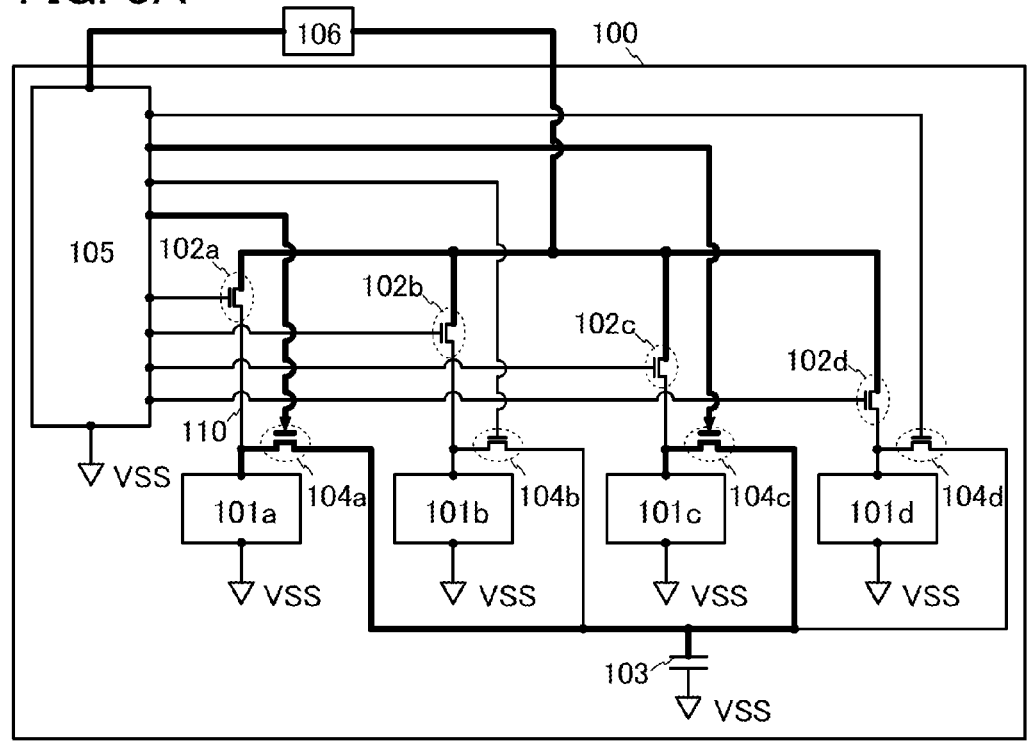
FIGS. 3A and 3B are block diagrams illustrating operating states of a semiconductor device.
Figure 3B:
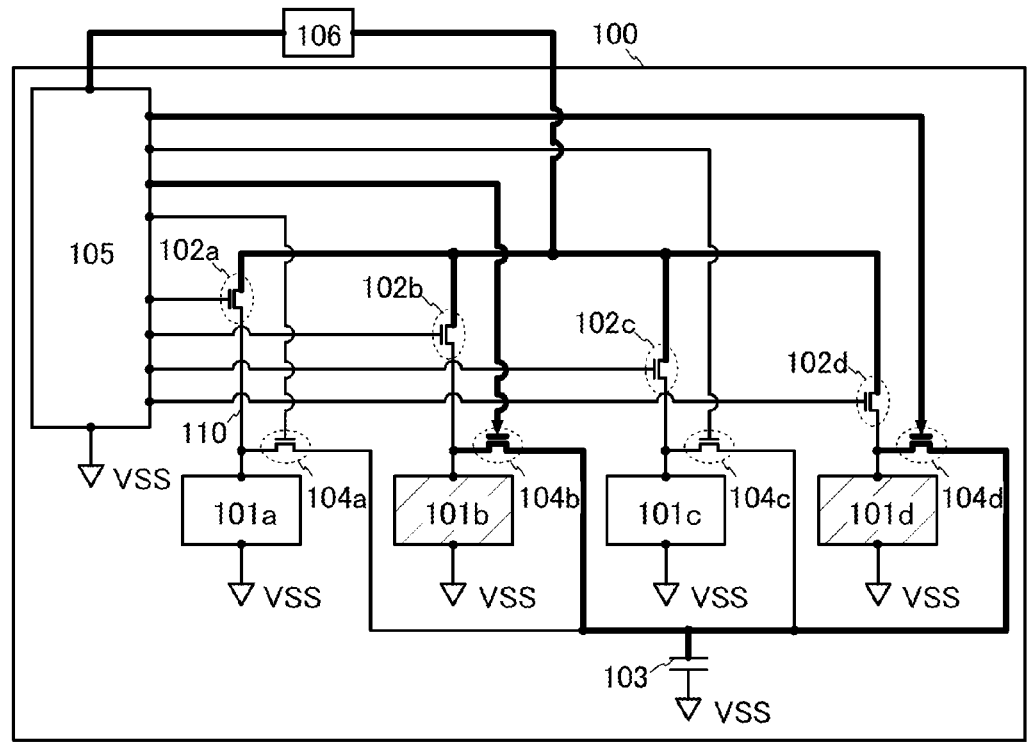

Note that the function blocks 101*b* and 101*d* illustrated in FIG. 3B are hatched at a long distance between the hatch lines, which means that the voltages of the function blocks 101*b* and 101*d* are increased by the amount of electric charge supplied from the capacitor 103 (not reach the operation voltage).

In addition, in this embodiment, the case where electric charge accumulated in the capacitor 103 is supplied to two function blocks (the function blocks 101*b* and 101*d*) is described; however, electric charge may be supplied to three or more function blocks at the same time.

<<Function Block Operation Step 2>>

Figure 4:
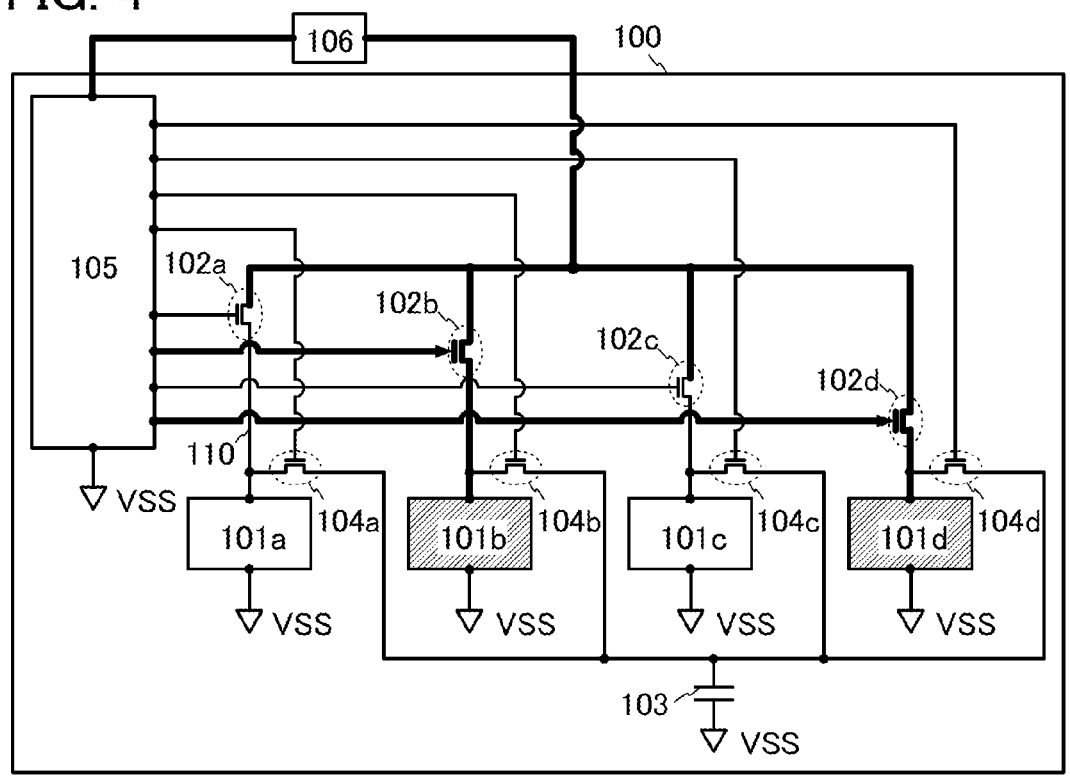
FIG. 4 is a block diagram illustrating an operating state of a semiconductor device.

Next, signals for turning on the first switching elements 102*b* and 102*d* are output from the control circuit 105 to turn on the first switching elements 102*b* and 102*d*, whereby power is supplied from the power source 106 to the function blocks 101*b* and 101*d* (see FIG. 4).

The voltages of the function blocks 101*b* and 101*d* are increased in the function block charging step, and therefore the function blocks 101*b* and 101*d* can be in an operating state by the supply of a small amount of power (the supply of a small amount of power from the power source 106). Accordingly, power consumption of the semiconductor device 100 can be low.

Note that the second switching elements 104*b* and 104*d* are preferably turned off before the first switching elements 102*b* and 102*d* are turned on. This is because when the first switching element and the second switching element are both turned on, power intended to be supplied to the function block flows to the capacitor 103, which might result in using a large amount of power to drive the function block.

Note that in the case where one or both of the function blocks 101*b* and 101*d* include a nonvolatile data retention system which can hold data even without the supply of power, and a state immediately before the function block 101*b* or 101*d* is in a not-operating state is written to the nonvolatile data retention system, it is preferable that priority be placed on reading the data in the function block operation step 2. By the reading of the data, the function block can be quickly restored to the state immediately before the function block becomes a not-operating state; therefore, the operation speed of the semiconductor device can be increased.

Note that the case where data written in the nonvolatile data retention system is read in the function block operation step 2 is described above. However, in the case where the nonvolatile data retention system is capable of operating in the function block charging step, the data may be read from the nonvolatile data retention system to the function block in the function block charging step.

The descriptions of the above steps are the description in the case where first, only the function blocks 101a and 101c operate (and are stopped) and then only the function blocks 101b and 101d operate. In steps subsequent to the above steps, only the function block which is necessary to operate selectively operates by employing the above steps (the function block stopping step, the capacitor charging step, the function block charging step, and the function block operation step); as a result, power consumption of the semiconductor device 100 can be reduced.

Embodiment 2

In this embodiment, a semiconductor device having a structure different from the semiconductor device in Embodiment 1 will be described with reference to FIG. 5. In addition, a method for driving the semiconductor device will be described with reference to FIGS. 6A and 6B and FIGS. 7A and 7B.

<Example of Structure of Semiconductor Device>

Figure 5:
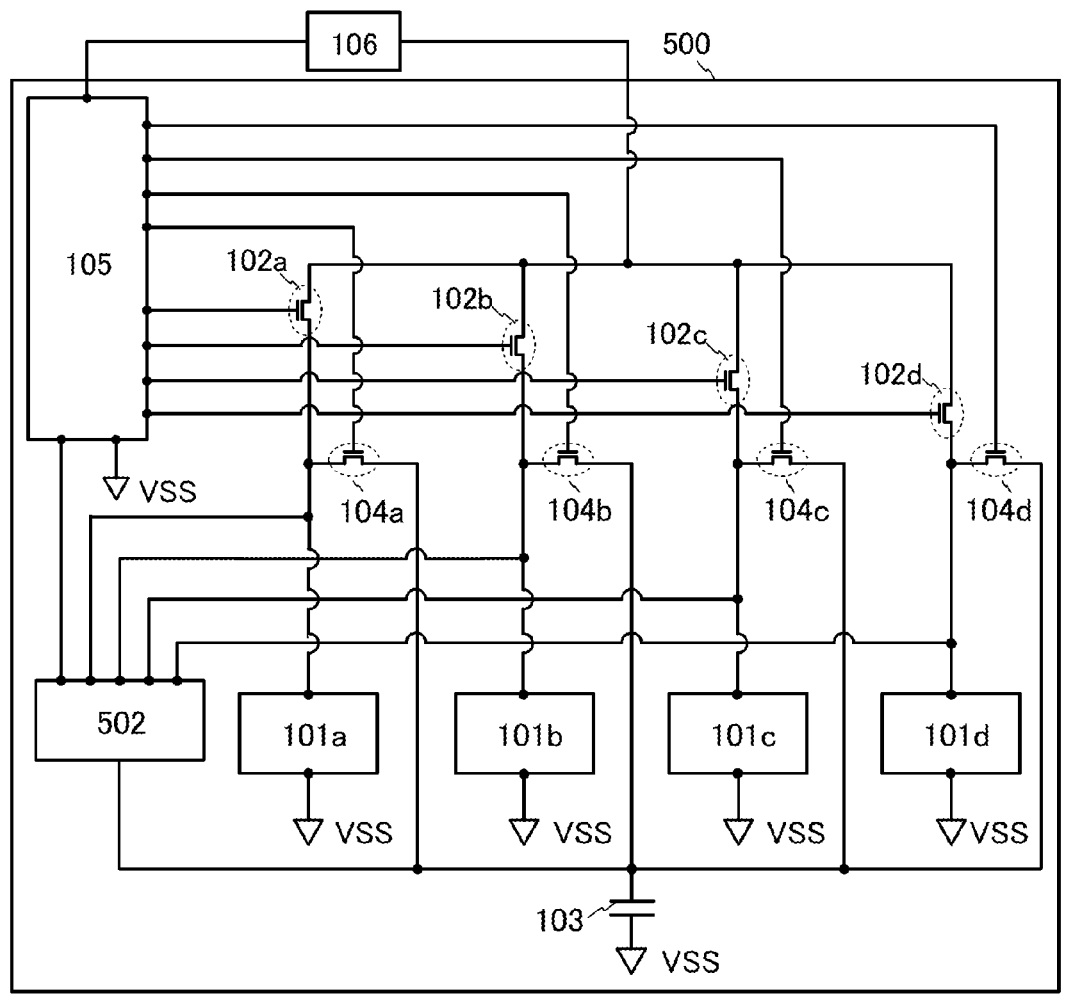
FIG. 5 is a block diagram illustrating one example of a structure of a semiconductor device.

FIG. 5 is a block diagram illustrating one example of a semiconductor device which has an effect described in this specification or the like and is different from that in Embodiment 1. A semiconductor device 500 includes the function blocks 101a to 101d, the first switching elements 102a to 102d which is electrically connected to the function blocks 101a to 101d and determine states of supplying power to the function blocks, the capacitor 103 one of the electrodes of which is connected to a wiring between the function blocks and the first switching elements and the other of the electrodes of which is connected to a wiring for supplying a fixed potential, the second switching elements 104a to 104d which are provided between the function blocks and the capacitor 103 and determine conduction states between the function blocks and the capacitor, the control circuit 105 which determines conduction states of the first switching elements 102a to 102d and the second switching elements 104a to 104d, and a potential comparing unit 502 which compares a potential applied to a high potential power supply line of each of the function blocks and a potential applied to the one of the electrodes of the capacitor to output the comparison results (or an operation instruction on the basis of the comparison results) to the control circuit 105. Note that power is supplied from the power source 106 to the function blocks 101a to 101d and the control circuit 105 which are included in the semiconductor device 500.

The structure of the semiconductor device described in this embodiment is different from that of the semiconductor device described in Embodiment 1 in that the semiconductor device described in this embodiment includes the potential comparing unit 502 which is electrically connected to the function blocks, the capacitor 103, and the control circuit 105.

In the case where the semiconductor device described in Embodiment 1 not including the potential comparing unit 502, for example, when the potential of the one of the electrodes of the capacitor 103 is higher than the potential of the high potential power supply line of the function block 101a in the capacitor charging step (see Embodiment 1), unexpected supply of electric charge might occur such that electric charge is supplied from the capacitor 103 to the function block 101a.

On the other hand, in the semiconductor device 500 in this embodiment, in the capacitor charging step, only when the potential of the one of the electrodes of the capacitor 103 is determined as being lower than the potential of the high potential power supply line of the function block 101a by the potential comparing unit 502, a signal for turning on the second switching element 104a can be output from the potential comparing unit 502 to the control circuit 105 to turn on the second switching element 104a. That is, when the potential of the one of the electrodes of the capacitor 103 is determined as being higher than the potential of the high potential power supply line of the function block 101a by the potential comparing unit 502, the capacitor charging step can be cancelled. With the structure, the above unexpected supply of electric charge can be prevented.

In the case where the semiconductor device described in Embodiment 1 not including the potential comparing unit 502, for example, when the potential of the high potential power supply line of the function block 101a is higher than the potential of the one of the electrodes of the capacitor 103 in the function block charging step (see Embodiment 1), unexpected supply of electric charge might occur such that electric charge is supplied from the function block 101a to the capacitor 103.

On the other hand, in the semiconductor device 500 in this embodiment, in the function block charging step, only when the potential of the high potential power supply line of the function block 101a is determined as being lower than the potential of the one of the electrodes of the capacitor 103 by the potential comparing unit 502, a signal for turning on the second switching element 104a can be output from the potential comparing unit 502 to the control circuit 105 to turn on the second switching element 104a. That is, when the potential of the high potential power supply line of the function block 101a is determined as being higher than the potential of the one of the electrodes of the capacitor 103 by the potential comparing unit 502, the function block charging step can be cancelled. With the structure, the above unexpected supply of electric charge can be prevented.

Note that the potential comparing unit 502 can be any structure as long as the potentials of the high potential power supply lines of the function blocks, the potential of the one of the electrodes of the capacitor 103, and a potential difference between the potentials can be measured. The potential comparing unit 502 can be formed by known techniques.

<Method for Driving Semiconductor Device>

Next, a method for driving the semiconductor device illustrated in FIG. 5 (also referred to as an operation flow) will be described with reference to FIGS. 6A and 6B and FIGS. 7A and 7B.

In this embodiment, as in Embodiment 1, the case where first, the function blocks 101a and 101c operate (and are stopped) and then only the function blocks 101b and 101d operate will be described. In addition, an effect of reducing power consumption of the semiconductor device 500 by the operation will be described.

<<Function Block Operation Step and Function Block Stopping Step>>

Figure 6A:
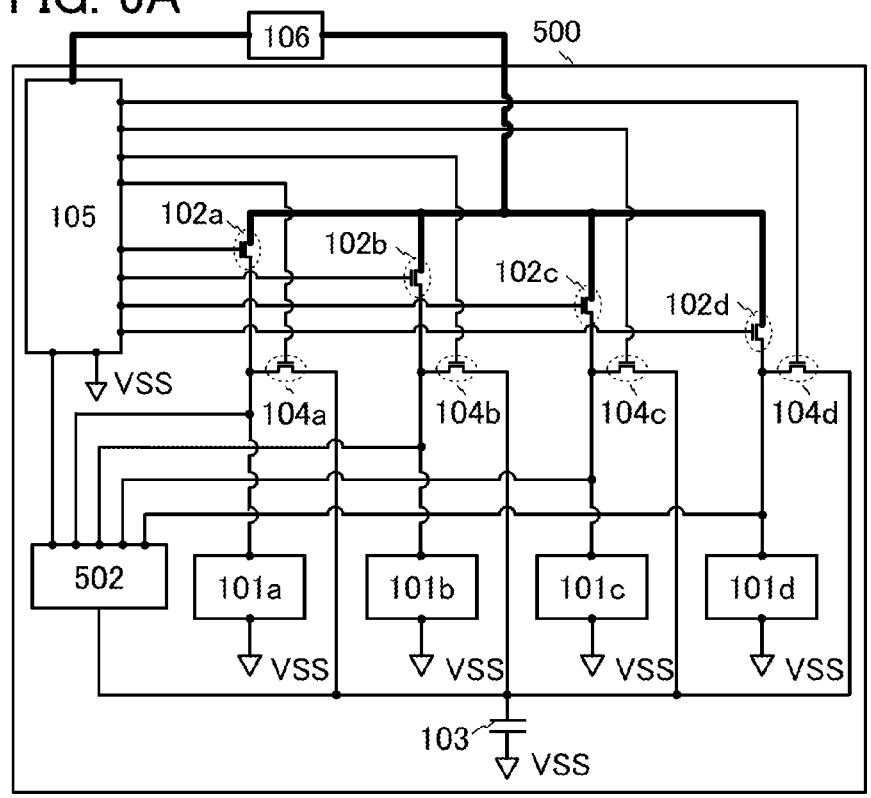
FIGS. 6A and 6B are block diagrams illustrating operating states of a semiconductor device.

First, the function block operation step 1 described in Embodiment 1 is performed to supply power to the function blocks 101a and 101c, and then the function block stopping step described in Embodiment 1 is performed to stop the operations of the function blocks 101a and 101c (see FIG. 6A).

At this time, electric charge is accumulated in the function blocks 101a and 101c, the wiring between the function block 101a and the first switching element 102a, and the wiring between the function block 101*c* and the first switching element 102*c*. The electric charge flows out through VSS over time.

<<Capacitor Charging Step>>

Next, as described in Embodiment 1, electric charge accumulated in the not-operating function block is supplied to the capacitor 103.

However, in the case where the potential of the one of the electrodes of the capacitor 103 is higher than the potential of the high potential power supply line of each of the function blocks when electric charge is supplied from the function blocks to the capacitor (the capacitor charging step is performed), electric charge is supplied from the capacitor 103 to the function blocks. Thus, by the capacitor charging step, the potential of the one of the electrodes of the capacitor 103 is unintentionally lowered.

In order to avoid the above phenomenon, in a capacitor charging step in this embodiment, a potential applied to the high potential power supply line of the function block 101*a* that stops operating (hereinafter, in this specification and the like, denoted by V1*a*), a potential applied to the high potential power supply line of the function block 101*c* which is in a not-operating state (hereinafter, in this specification and the like, denoted by V1*c*), and a potential applied to the one of the electrodes of the capacitor 103 (hereinafter, in this specification and the like, denoted by V3) are measured with the potential comparing unit 502.

Figure 6B:
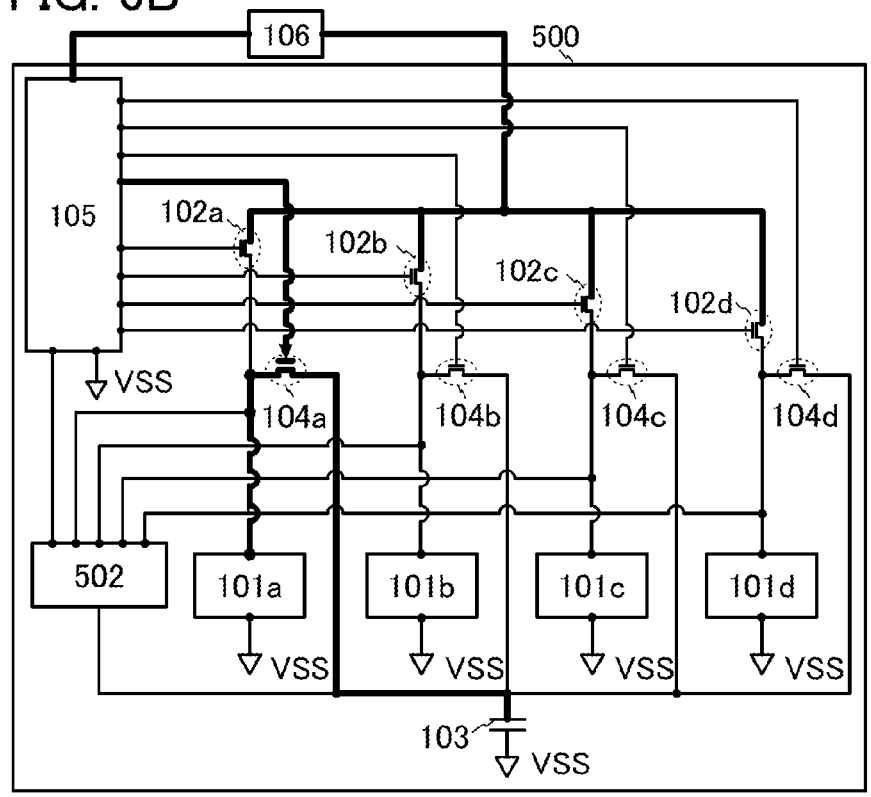

In addition, when a potential applied to the high potential power supply line of the function block is higher than a potential applied to the one of the electrodes of the capacitor, the second switching element connected to the function block is turned on. Accordingly, electric charge is supplied from the function block to the capacitor. For example, when "V1*a*>V3" and "V1*c*<V3" are satisfied in the function block 101*a*, the function block 101*c*, and the capacitor 103, only the second switching element 104*a* is turned on to supply electric charge from only the function block 101*a* to the capacitor 103, as illustrated in FIG. 6B.

As described above, a potential applied to the high potential power supply line of the function block is compared to a potential applied to the one of the electrodes of the capacitor in the capacitor charging step so that electric charge does not flow from the capacitor to the function block. As a result, electric charge can be effectively accumulated in the capacitor 103, which leads to low power consumption of the semiconductor device 500.

After that, a signal for turning off the second switching element 104*a* is output from the control circuit 105 to turn off the second switching element 104*a*, whereby electric charge supplied from the function block 101*a* is held in the capacitor 103.

<<Function Block Charging Step>>

After the operations of the function blocks 101*a* and 101*c* are stopped, electric charge accumulated in the capacitor 103 in the above step is supplied to the function blocks 101*b* and 101*d* in advance so that the function blocks 101*b* and 101*d* operate by the supply of a small amount of power (the supply of a small amount of power from the power source 106), as described in Embodiment 1.

However, in the case where the potential of the high potential power supply line of the function block is higher than the potential of the one of the electrodes of the capacitor 103 when electric charge is supplied from the capacitor to the function block (the function block charging step is performed), electric charge is supplied from the function block to the capacitor 103. Thus, by the function block charging step, the potential of the high potential power supply line of the function block 101*b* is unintentionally lowered.

In order to avoid the above phenomenon, in a function block charging step in this embodiment, a potential applied to the high potential power supply line of the function block 101*b* immediately before starting operating (hereinafter, in this specification and the like, denoted by a potential V1*b*), a potential applied to the high potential power supply line of the function block 101*d* immediately before starting operating (hereinafter, in this specification and the like, denoted by a potential V1*d*), and a potential applied to the one of the electrodes of the capacitor 103 (V3) are measured with the potential comparing unit 502.

Figure 7A:
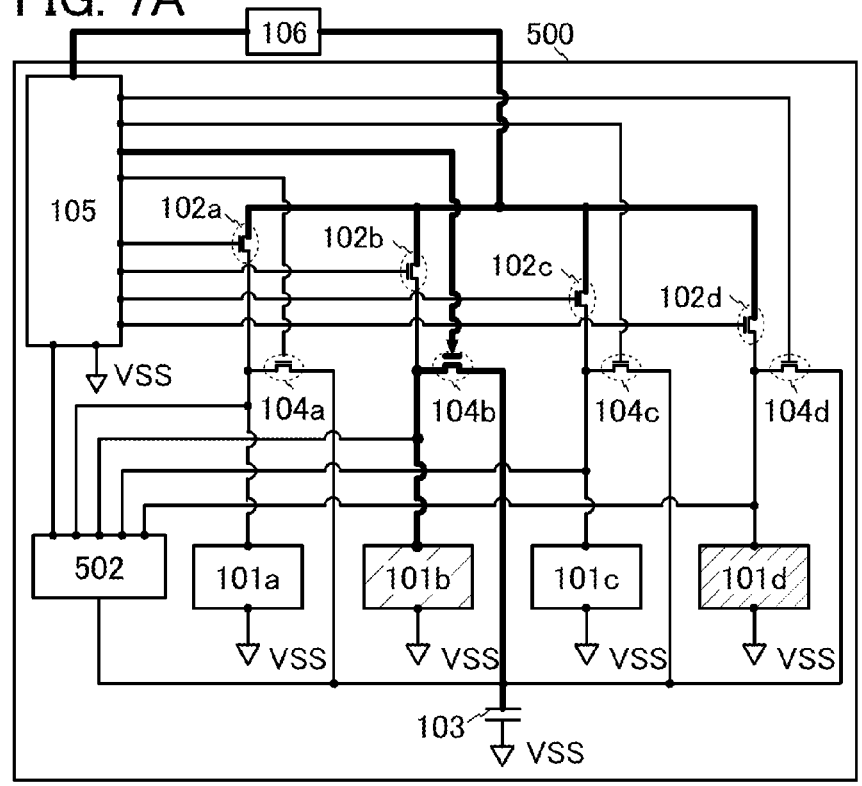
FIGS. 7A and 7B are block diagrams illustrating operating states of a semiconductor device.
Figure 7B:
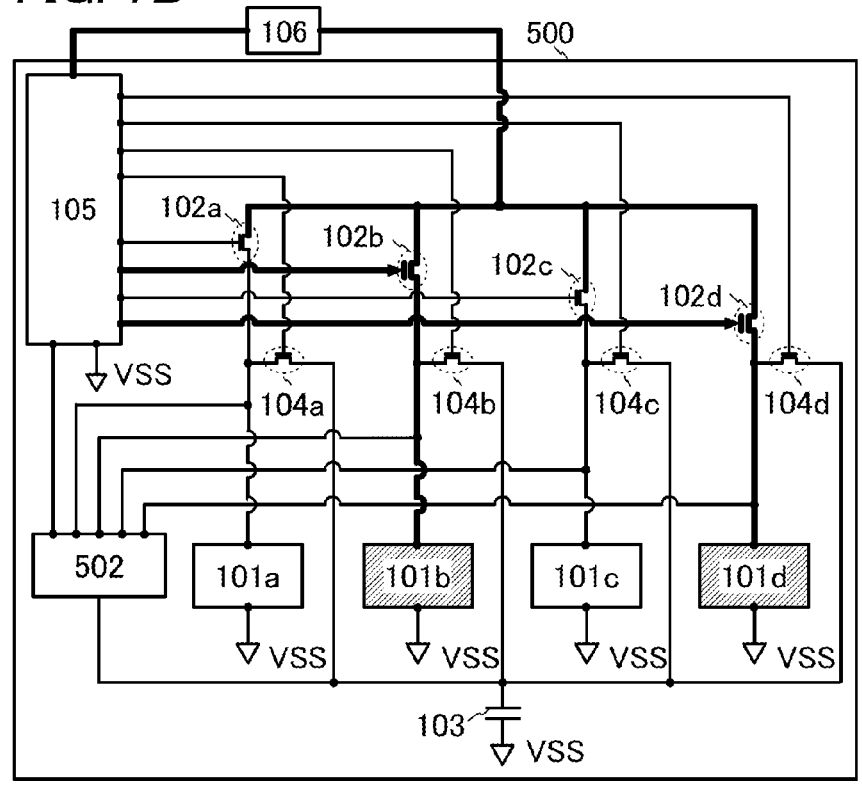

In addition, when a potential applied to the high potential power supply line of the function block is lower than a potential applied to the one of the electrodes of the capacitor, the second switching element connected to the function block is turned on. Accordingly, electric charge is supplied from the capacitor to the function block. For example, when "V1*b*<V3" and "V1*d*>V3" are satisfied in the function block 101*b*, the function block 101*d*, and the capacitor 103, only the second switching element 104*b* is turned on to supply electric charge from the capacitor 103 to the function block 101*b*, as illustrated in FIG. 7A. In addition, the supply of electric charge from the capacitor is stopped at the time when the potential of the high potential power supply line of the function block and the potential of the one of the electrodes of the capacitor become equal to each other.

As described above, a potential applied to the high potential power supply line of the function block is compared to a potential applied to the one of the electrodes of the capacitor in the function block charging step so that electric charge does not flow from the function block to the capacitor. As a result, electric charge accumulated in the function block is not reduced, which leads to low power consumption of the semiconductor device 500.

Accordingly, the voltages of the function blocks 101*b* and 101*d* are increased. The level to which the voltage of the function block is increased by the supply of electric charge from the capacitor 103 is determined depending on the amount of electric charge accumulated in the capacitor 103. In addition, the supply of electric charge from the capacitor is stopped at the time when the potential of the high potential power supply line of the function block and the potential of the one of the electrodes of the capacitor become equal to each other.

Note that the function block 101*b* illustrated in FIG. 7A are hatched at a long distance between the hatch lines, which means that the voltage of the function block 101*b* are increased by the amount of electric charge supplied from the capacitor 103 (not reaches the operation voltage). In addition, the function block 101*d* illustrated in FIG. 7A are hatched at a shorter distance between the hatch lines than that in the function block 101*b*, which means that the potential of the high potential power supply line of the function block 101*d* is higher than the potential of the one of the electrodes of the capacitor (V3), and that a large amount of electric charge is stored in the function block even without the supply of electric charge from the capacitor 103.

In addition, in this embodiment, the case where electric charge accumulated in the capacitor 103 are supplied to one function block (the function block 101*b*) is described; however, electric charge may be supplied to two or more function blocks at the same time.

<<Function Block Operation Step 2>>

Next, in a manner similar to the function block operation step 2 described in Embodiment 1, power is supplied from the power source 106 to the function blocks 101b and 101d (see FIG. 4).

The voltages of the function block 101b are increased in the function block charging step, and therefore the function block 101b can be in an operating state by the supply of a small amount of power (the supply of a small amount of power from the power source 106). Also in the function block 101d, at least the potential of the one of the electrodes of the capacitor is higher than the potential of the high potential power supply line, and therefore the function block 101d can be in an operating state by the supply of a small amount of power (the supply of a small amount of power from the power source 106). Accordingly, power consumption of the semiconductor device 500 can be low.

The descriptions of the above steps are the description of the case where first, only the function blocks 101a and 101c operate (and are stopped) and then only the function blocks 101b and 101d operate. In steps subsequent to the above steps, only the function block necessary to operate may selectively operate by employing the above steps (the function block stopping step, the capacitor charging step, the function block charging step, and the function block operation step).

As described above, a semiconductor device includes the potential comparing unit 502 which is electrically connected to each of the function blocks, the capacitor 103, and the control circuit 105, whereby electric charge is prevented from flowing from the capacitor 103 to each of the function blocks in the capacitor charging step and prevented from flowing from each of the function blocks to the capacitor 103 in the function block charging step. Therefore, effect of reducing power consumption of the semiconductor device can be improved.

Figure 13A:
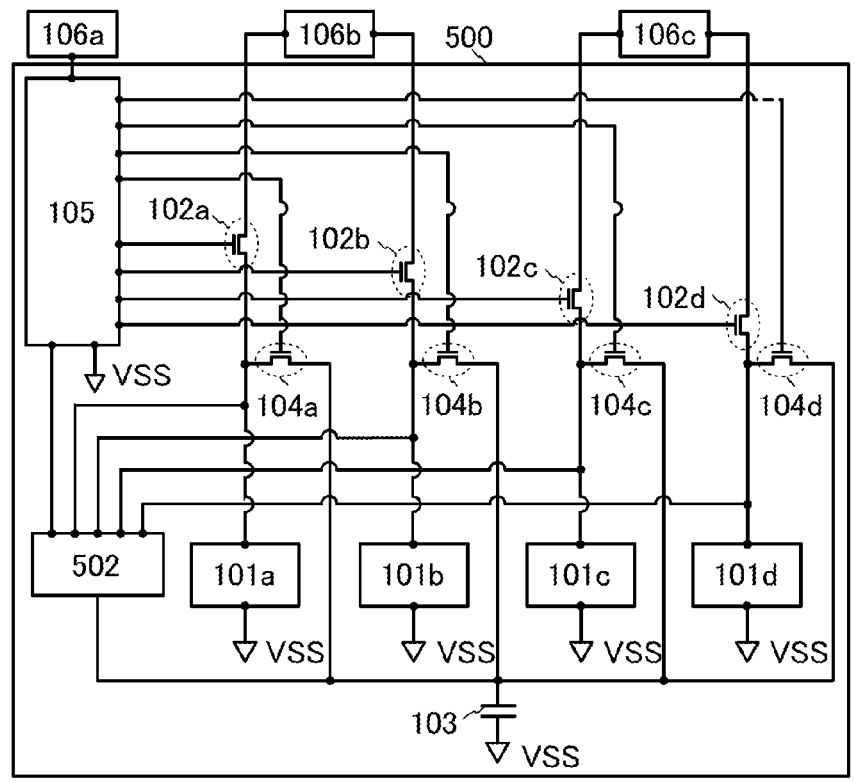
FIGS. 13A and 13B are diagrams each illustrating a modification example of Embodiment 2.

Note that in this embodiment, a semiconductor device in which the function blocks 101a to 101d are all connected to one power source (the high potential power supply lines of the function blocks 101a to 101d are all connected to one power source) is described. Of course, an embodiment of the present invention is not limited to such a structure. For example, as illustrated in FIG. 13A, the high potential power supply lines of the function blocks and the control circuit may be connected to power sources with different potentials as follows: the control circuit 105 is connected to a power source 106a, the high potential power supply lines of the function blocks 101a and 101b are connected to a power source 106b, and the high potential power supply lines of the function blocks 101c and 101d are connected to a power source 106c.

Potentials applied to the high potential power supply lines are greatly different depending on the types or the sizes of the function blocks. For example, the function blocks 101a and 101b are central arithmetic processing devices and the function blocks 101c and 101d are cache memories for the function blocks 101a and 101b, in which case the potentials needed for the operations of the function blocks 101a and 101b are greatly different from the potentials needed for the operations of the function blocks 101c and 101d; therefore, different power sources are preferably used.

In the case where different power sources are used as described above (in particular, the potentials of the power sources are greatly different), the following phenomena easily occur: electric charge cannot be supplied to the capacitor in the capacitor charging step because as in the function block 101c in FIG. 6B, a potential applied to the one of the electrodes of the capacitor is higher than a potential applied to the high potential power supply line of the function block, and alternatively, electric charge cannot be supplied to the function block in the function block charging step because as in the function block 101d in FIG. 7A, a potential applied to the high potential power supply line of the function block is higher than a potential applied to the one of the electrodes of the capacitor.

Therefore, the structure and the method described in this embodiment are very effective, in which a potential applied to the high potential power supply line of the function block is compared to a potential applied to the one of the electrodes of the capacitor with the potential comparing unit, and then the conduction states of the first switching element and the second switching element are determined on the basis of the results of the comparison.

Figure 13B:
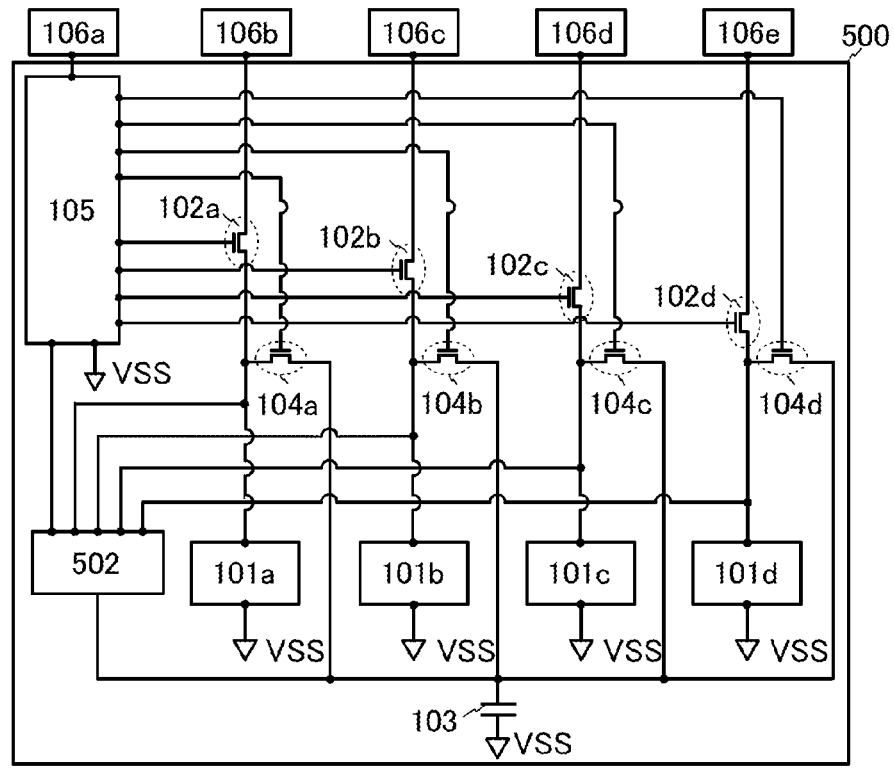

Further, the structure and the method described in this embodiment are very effective even for the structure where the high potential power supply lines of the function blocks are connected to different power sources (power sources 106b to 106e) as illustrated in FIG. 13B.

Figure 14:
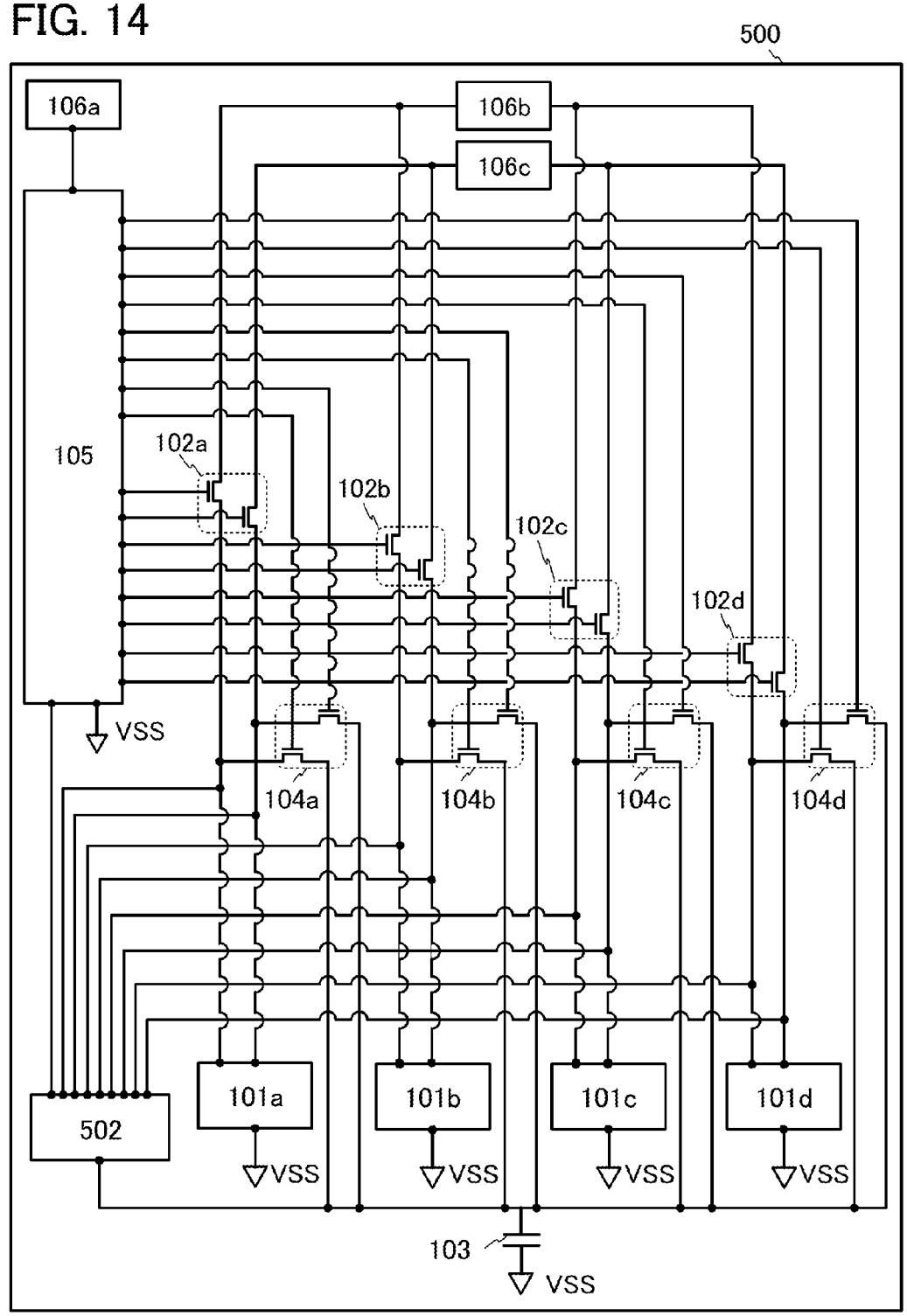
FIG. 14 is diagram illustrating a modification example of Embodiment 2.

Furthermore, the structure and the method described in this embodiment are very effective even for the structure where a plurality of high potential power supply lines are connected to one function block as illustrated in FIG. 14.

Embodiment 3

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, still cameras, video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices are illustrated in FIGS. 8A and 8B.

Figure 8A:
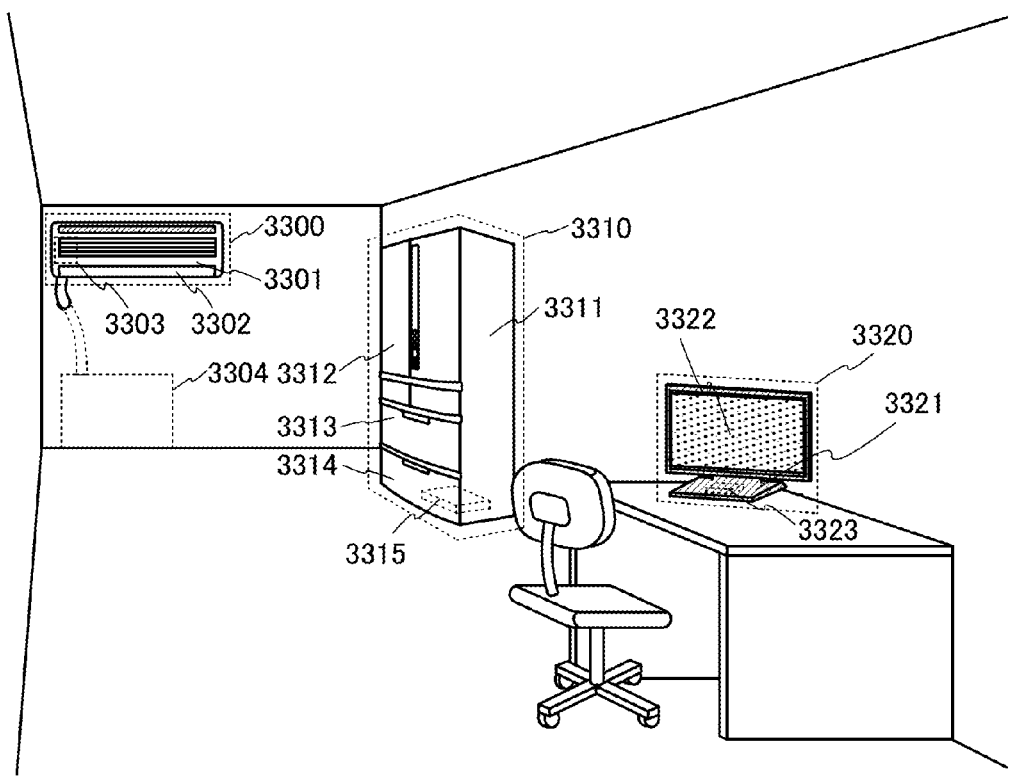
FIGS. 8A and 8B are diagrams illustrating examples of electronic devices including semiconductor devices.
Figure 8B:
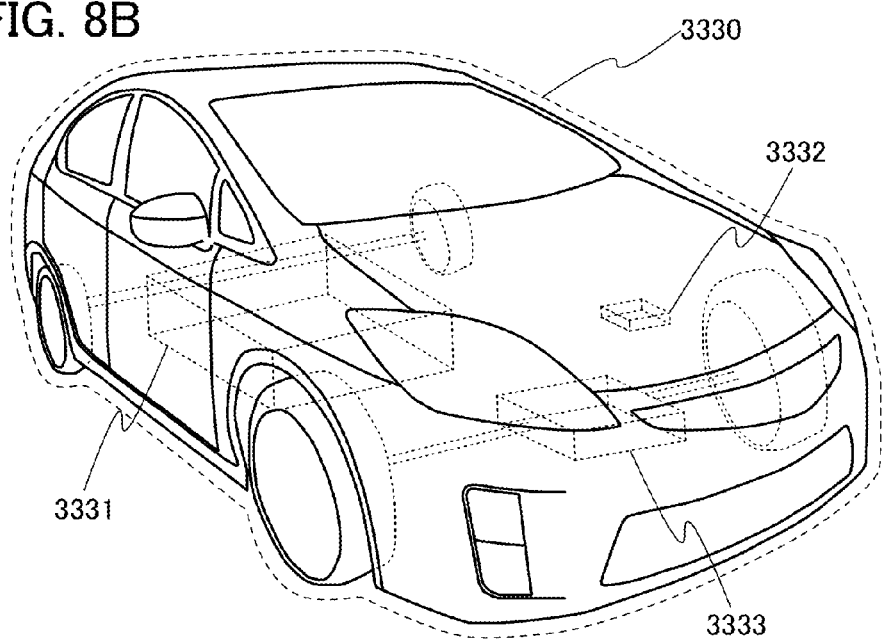
Figure 9:
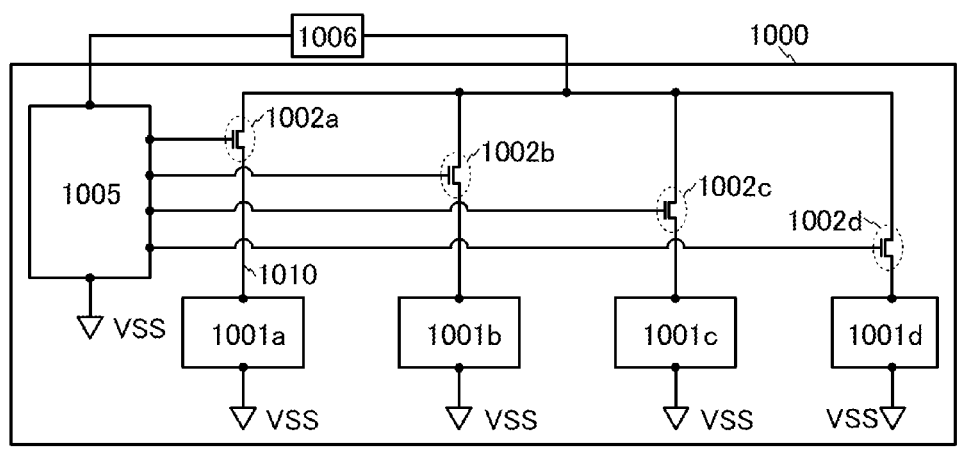
FIG. 9 is a block diagram illustrating one example of a structure of a semiconductor device capable of performing power gating.
Figure 10A:
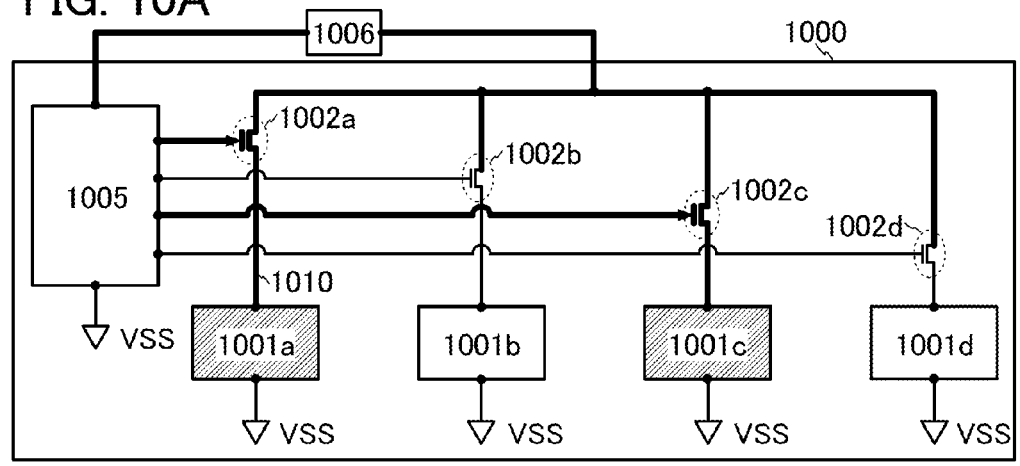
FIGS. 10A to 10C are diagrams illustrating operating states of a semiconductor device capable of performing power gating.
Figure 10B:
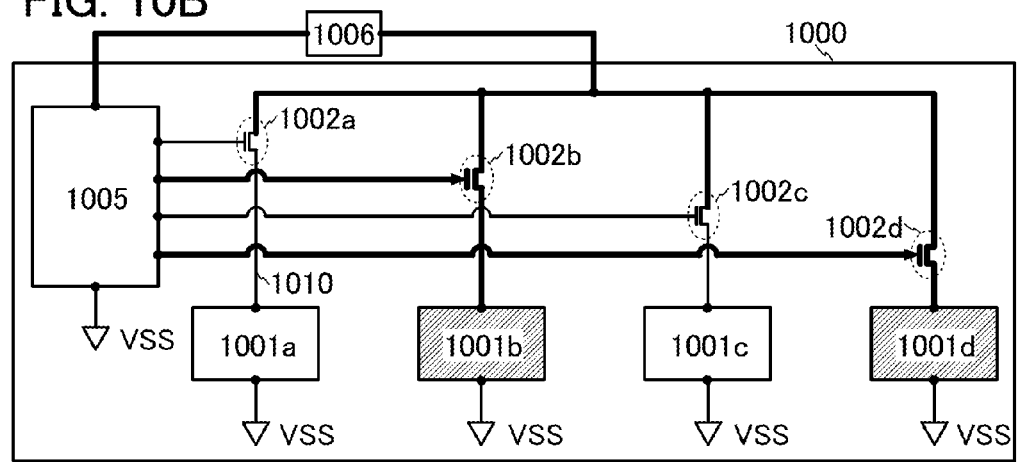
Figure 10C:
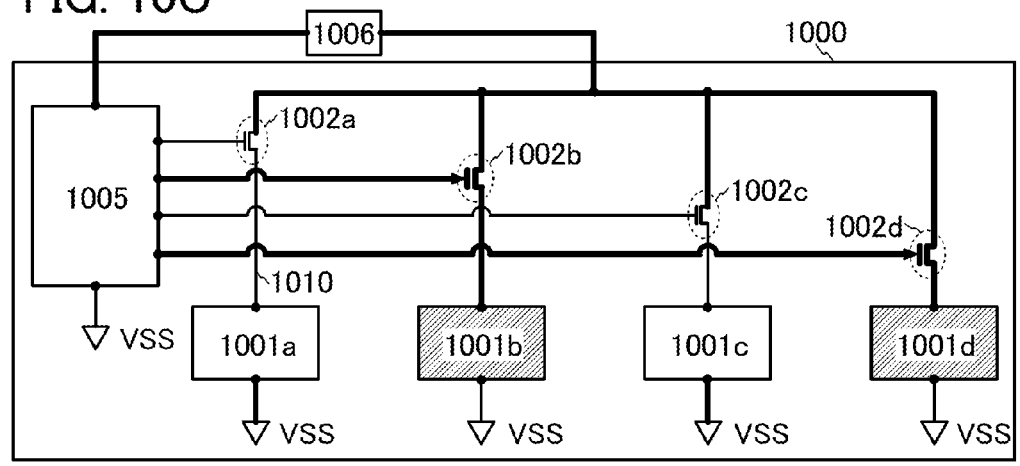

In FIG. 8A, an air conditioner which includes an indoor unit 3300 and an outdoor unit 3304 is an example of an electronic device in which the semiconductor device described in the above embodiment is used. Specifically, the indoor unit 3300 includes a housing 3301, an air outlet 3302, a semiconductor device 3303, and the like. Although the semiconductor device 3303 is provided in the indoor unit 3300 in FIG. 8A, the semiconductor device 3303 may be provided in the outdoor unit 3304. Alternatively, the semiconductor device 3303 may be provided in both the indoor unit 3300 and the outdoor unit 3304. The semiconductor device 3303 is a semiconductor device described in the above embodiments which has a function of supplying electric charge from a not-operating function block to a capacitor and of supplying electric charge from a capacitor to a function block immediately before starting operating. Electric charge which contributes nothing to the operation can be used for adjusting the operation state of the function block in accordance with the operation state of the air conditioner; thus, power consumption of the air conditioner can be reduced.

In FIG. 8A, an electric refrigerator-freezer 3310 is an example of an electronic device which is provided with the semiconductor device described in the above embodiments. Specifically, the electric refrigerator-freezer 3310 includes a housing 3311, a door for a refrigerator 3312, a door for a freezer 3313, a door for a vegetable drawer 3314, a semiconductor device 3315 provided in the housing 3311, and the like. The semiconductor device 3315 is a semiconductor device described in the above embodiments which has a function of supplying electric charge from a not-operating function block to a capacitor and of supplying electric charge from a capacitor to a function block immediately before starting operating. Electric charge which contributes nothing to the operation can be used for adjusting the operation state of the function block in accordance with the operation state of the electric refrigerator-freezer 3310; thus, power consumption of the electric refrigerator-freezer 3310 can be reduced.

In FIG. 8A, an image display device 3320 is an example of an electronic device which is provided with the semiconductor device described in the above embodiments. Specifically, the image display device 3320 includes a housing 3321, a display portion 3322, a semiconductor device 3323 provided in the housing 3321, and the like. The semiconductor device 3323 is a semiconductor device described in the above embodiments which has a function of supplying electric charge from a not-operating function block to a capacitor and of supplying electric charge from a capacitor to a function block immediately before starting operating. Electric charge which contributes nothing to the operation can be used for adjusting the operation state of the function block in accordance with the operation state of the image display device 3320; thus, power consumption of the image display device 3320 can be reduced.

FIG. 8B illustrates an electric vehicle which is an example of an electronic device. An electric vehicle 3330 is equipped with a secondary battery 3331. The output of the electric power of the secondary battery 3331 is adjusted by a control device 3332 and the electric power is supplied to a driving device 3333. The control device 3332 includes ROM (not illustrated), RAM (not illustrated), a semiconductor device (not illustrated), and the like. The semiconductor device is a semiconductor device described in the above embodiments which has a function of supplying electric charge from a not-operating function block to a capacitor and of supplying electric charge from a capacitor to a function block immediately before starting operating. Electric charge which contributes nothing to the operation can be used for adjusting the operation state of the function block in accordance with the running state of the electric vehicle, environment around the electric vehicle, or the like; thus, power consumption of the semiconductor device can be reduced. Accordingly, power consumption of the control device 3332 can be reduced, which enables a reduction in power consumption of the electric vehicle 3330.

This embodiment can be combined with any of the other embodiments as appropriate.

This application is based on Japanese Patent Application serial no. 2012-104284 filed with Japan Patent Office on Apr. 30, 2012 and Japanese Patent Application serial no. 2013-053383 filed with Japan Patent Office on Mar. 15, 2013, the entire contents of which are hereby incorporated by reference.

What is claimed is:

1. A semiconductor device comprising:
   a function block configured to perform power gating;
   a first transistor;
   a second transistor;
   a power source;
   a capacitor; and
   a control circuit,
   wherein one of a source and a drain of the first transistor is electrically connected to the function block and one of a source and a drain of the second transistor,
   wherein one electrode of the capacitor is electrically connected to the other of the source and the drain of the second transistor,
   wherein the other electrode of the capacitor is electrically connected to a wiring for supplying a fixed potential,
   wherein the power source is electrically connected to the other of the source and the drain of the first transistor,
   wherein the control circuit is electrically connected to a gate of the first transistor and a gate of the second transistor, and
   wherein the gate of the first transistor is not electrically connected to the gate of the second transistor.

2. The semiconductor device according to claim 1, further comprising:
   a potential comparing unit configured to compare a potential applied to a high potential power supply line of the function block and a potential applied to the one electrode of the capacitor and output an operation instruction to the control circuit on the basis of a comparison result,
   wherein when the comparison result obtained by the potential comparing unit shows that the potential applied to the high potential power supply line of the function block is higher than the potential applied to the one electrode of the capacitor, supply of power to the function block is stopped and then the second transistor is turned on, so that electric charge is supplied to the capacitor, and
   wherein when the comparison result obtained by the potential comparing unit shows that the potential applied to the high potential power supply line of the function block is lower than the potential applied to the one electrode of the capacitor, electric charge is supplied from the capacitor and then power is supplied to the function block.

3. The semiconductor device according to claim 1, wherein the function block comprises a data retention system which is configured to retain data even without supply of power.

4. An electronic device comprising the semiconductor device according to claim 1.

5. A semiconductor device comprising:
   a plurality of function blocks configured to perform power gating;

a plurality of first switching elements each configured to determine states of a supplying power to the plurality of function blocks;

a capacitor having a pair of electrodes one of which is connected to at least two of the plurality of function blocks and the other of which is connected to a wiring for supplying a fixed potential;

a plurality of second switching elements each electrically connected to respective one of the plurality of function blocks and each configured to determine a plurality of conductions state between respective one of the plurality of function blocks and one of the pair of electrodes of the capacitor, the plurality of second switching elements being electrically connected to the one of the pair of electrodes of the capacitor;

a control circuit which is electrically connected to the plurality of first switching elements and the plurality of second switching elements and is configured to control a conduction state of each of the plurality of first switching elements and a conduction state of each of the plurality of second switching elements; and a potential comparing unit configured to compare a potential applied to a high potential power supply line of each of the plurality of function blocks and a potential applied to the one of the pair of electrodes of the capacitor and output an operation instruction to the control circuit on the basis of a comparison result, wherein the control circuit is configured to stop supply of power to at least one of the plurality of function blocks and then turn on at least one of the plurality of the second switching elements, so that electric charge is supplied to the capacitor, and wherein electric charge is supplied from the capacitor and then power is supplied to at least one of the plurality of function blocks.

6. The semiconductor device according to claim 5, further comprising:

wherein when the comparison result obtained by the potential comparing unit shows that the potential applied to the high potential power supply line of each of the plurality of function blocks is higher than the potential applied to the one of the pair of electrodes of the capacitor, the supply of power to at least one of the plurality of function blocks is stopped and then at least one of the plurality of second switching elements is turned on, so that electric charge is supplied to the capacitor, and wherein when the comparison result obtained by the potential comparing unit shows that the potential applied to the high potential power supply line of each of the plurality of function blocks is lower than the potential applied to the one of the pair of electrodes of the capacitor, electric charge is supplied from the capacitor and then power is supplied to at least one of the plurality of function blocks.

7. The semiconductor device according to claim 5, wherein at least one of the plurality of function blocks comprises a data retention system which is configured to retain data even without the supply of power.

8. An electronic device comprising the semiconductor device according to claim 5.

9. A method for driving a semiconductor device comprising:
a function block configured to perform power gating;
a first transistor;
a second transistor;
a capacitor; and
a control circuit, wherein one of a source and a drain of the first transistor is electrically connected to the function block and one of a source and a drain of the second transistor, wherein one electrode of the capacitor is electrically connected to the other of the source and the drain of the second transistor, wherein the other electrode of the capacitor is electrically connected to a wiring for supplying a fixed potential, wherein the control circuit is electrically connected to a gate of the first transistor and a gate of the second transistor, wherein the gate of the first transistor is not electrically connected to the gate of the second transistor, and wherein the first transistor and the second transistor are not turned on concurrently, the method comprising:
performing a function block stopping step in which the first transistor is turned off to stop supply of power to the function block, so that an operation of the function block is stopped;
performing a capacitor charging step in which after the function block stopping step, the second transistor is turned on to supply electric charge from the function block to the capacitor;
performing a function block operation step in which the first transistor is turned on to supply power to the function block, so that the function block operates; and
performing a function block charging step in which before the function block operation step, the second transistor is turned on to supply electric charge from the capacitor to the function block.

10. The method for driving the semiconductor device according to claim 9, further comprising:
a potential comparing unit configured to compare a potential applied to a high potential power supply line of the function block and a potential applied to the one electrode of the capacitor and output an operation instruction to the control circuit on the basis of a comparison result, wherein the capacitor charging step is performed when the potential applied to the high potential power supply line of the function block is lower than the potential applied to the one electrode of the capacitor as the comparison result, and wherein the function block charging step is performed when the potential applied to the high potential power supply line of the function block is higher than the potential applied to the one electrode of the capacitor as the comparison result.

11. The method for driving the semiconductor device according to claim 9 in which the function block includes a data retention system configured to retain data even without the supply of power, the method comprising steps of:
writing a state of the function block to the data retention system before completion of the function block stopping step; and
reading content written to the data retention system to the function block immediately after start of the function block operation step.

12. A method for driving a semiconductor device comprising:
a plurality of function blocks configured to perform power gating;
a plurality of first switching elements each configured to determine states of a supplying power to the plurality of function blocks;

a capacitor having a pair of electrodes one of which is connected to at least two of the plurality of function blocks and the other of which is connected to a wiring for supplying a fixed potential;

a plurality of second switching elements each electrically connected to respective one of the plurality of function blocks and each configured to determine a plurality of conductions state between respective one of the plurality of function blocks and one of the pair of electrodes of the capacitor, the plurality of second switching elements being electrically connected to the one of the pair of electrodes of the capacitor; and a control circuit which is electrically connected to the plurality of first switching elements and the plurality of second switching elements and is configured to control a conduction state of each of the plurality of first switching elements and a conduction state of each of the plurality of second switching elements, the method comprising:

performing a function block stopping step in which at least one of the plurality of first switching elements is turned off to stop supply of power to at least one of the plurality of function blocks;

performing a capacitor charging step in which after the function block stopping step, at least one of the plurality of second switching elements is turned on to supply electric charge from at least one of the plurality of function blocks to the capacitor;

performing a function block operation step in which at least one of the plurality of first switching elements is turned on to supply power to at least one of the plurality of function blocks; and performing a function block charging step in which before the function block operation step, at least one of the plurality of second switching elements is turned on to supply electric charge from the capacitor to at least one of the plurality of function blocks.

13. The method for driving the semiconductor device according to claim 12, further comprising:

a potential comparing unit configured to compare each of a potential applied to a high potential power supply line of the plurality of function blocks and a potential applied to the one electrode of the capacitor and output an operation instruction to the control circuit on the basis of a comparison result, wherein the capacitor charging step is performed when at least one of the potentials applied to the high potential power supply lines of the plurality of function blocks is lower than the potential applied to the one electrode of the capacitor as the comparison result, and wherein the function block charging step is performed when at least one of the potentials applied to the high potential power supply lines of the plurality of function blocks is higher than the potential applied to the one electrode of the capacitor as the comparison result.

14. The method for driving the semiconductor device according to claim 12 in which at least one of the plurality of function blocks includes a data retention system configured to retain data even without the supply of power, the method comprising steps of:

writing a state of at least one of the plurality of function blocks to the data retention system before completion of the function block stopping step; and reading content written to the data retention system to at least one of the plurality of function blocks immediately after start of the function block operation step.

15. The method for driving the semiconductor device, according to claim 12, wherein the plurality of first switching elements and the plurality of second switching elements are not turned on concurrently.

16. The method for driving the semiconductor device, according to claim 12, wherein in the function block charging step, electric charge is supplied to at least one of the plurality of function blocks which is different from the at least one of the plurality of function blocks supplied with electric charge in the capacitor charging step.

17. The method for driving the semiconductor device, according to claim 12, wherein electric charge is supplied to the capacitor from at least two of the plurality of function blocks concurrently.

18. The method for driving the semiconductor device according to claim 12, wherein electric charge is supplied from the capacitor to at least two of the plurality of function blocks concurrently.

19. The semiconductor device according to claim 1, wherein the control circuit is electrically connected to the gate of the first transistor via a first wiring, and wherein the control circuit is electrically connected to the gate of the second transistor via a second wiring.

* * * * *